United States Patent
Chen et al.

(10) Patent No.: US 11,201,084 B2
(45) Date of Patent: Dec. 14, 2021

(54) FIN FIELD-EFFECT TRANSISTOR DEVICE AND METHOD OF FORMING THE SAME

(71) Applicant: Taiwan Semiconductor Manufacturing Company, Ltd., Hsinchu (TW)

(72) Inventors: Chieh-Wei Chen, Hsinchu (TW); Jian-Jou Lian, Tainan (TW); Chun-Neng Lin, Hsinchu (TW); Tzu-Ang Chiang, Hsinchu (TW); Ming-Hsi Yeh, Hsinchu (TW)

(73) Assignee: Taiwan Semicondutor Manufacturing Company, Ltd., Hsinchu (TW)

( * ) Notice: Subject to any disclaimer, the term of this patent is extended or adjusted under 35 U.S.C. 154(b) by 0 days.

(21) Appl. No.: 16/550,101

(22) Filed: Aug. 23, 2019

(65) Prior Publication Data
US 2021/0057282 A1   Feb. 25, 2021

(51) Int. Cl.
*H01L 21/8234*   (2006.01)
*H01L 27/088*    (2006.01)
*H01L 21/311*    (2006.01)
*H01L 29/66*     (2006.01)

(52) U.S. Cl.
CPC ........... *H01L 21/823431* (2013.01); *H01L 21/31111* (2013.01); *H01L 21/31144* (2013.01); *H01L 27/0886* (2013.01); *H01L 29/66545* (2013.01)

(58) Field of Classification Search
CPC ....... H01L 21/823431; H01L 21/31111; H01L 21/31144; H01L 27/0886; H01L 29/66545
See application file for complete search history.

(56) References Cited

U.S. PATENT DOCUMENTS

| | | | |
|---|---|---|---|
| 8,487,378 B2 | 7/2013 | Goto et al. | |
| 8,729,634 B2 | 5/2014 | Shen et al. | |
| 8,826,213 B1 | 9/2014 | Ho et al. | |
| 8,887,106 B2 | 11/2014 | Ho et al. | |
| 10,607,895 B2 | 3/2020 | Xie et al. | |
| 2013/0299922 A1 | 11/2013 | Choi et al. | |
| 2014/0282326 A1 | 9/2014 | Chen et al. | |

(Continued)

FOREIGN PATENT DOCUMENTS

| | | |
|---|---|---|
| KR | 20140142957 A | 12/2014 |
| KR | 20150001449 A | 1/2015 |

(Continued)

*Primary Examiner* — Marc Anthony Armand
(74) *Attorney, Agent, or Firm* — Slater Matsil, LLP

(57) ABSTRACT

A method of forming a semiconductor device includes forming a first dummy gate structure and a second dummy gate structure over a fin protruding above a substrate, where the first dummy gate structure and the second dummy gate structure are surrounded by a dielectric layer; and replacing the first dummy gate structure and the second dummy gate structure with a first metal gate and a second metal gate, respectively, where the replacing includes: removing the first and the second dummy gate structures to form a first recess and a second recess in the dielectric layer, respectively; forming a gate dielectric layer in the first recess and in the second recess; forming an N-type work function layer and a capping layer successively over the gate dielectric layer in the second recess but not in the first recess; and filling the first recess and the second recess with an electrically conductive material.

20 Claims, 27 Drawing Sheets

(56) References Cited

U.S. PATENT DOCUMENTS

| | | | |
|---|---|---|---|
| 2014/0363960 A1 | 12/2014 | Kim et al. | |
| 2015/0004783 A1 | 1/2015 | Lee et al. | |
| 2015/0061042 A1 | 3/2015 | Cheng et al. | |
| 2015/0380407 A1 | 12/2015 | Ji et al. | |
| 2016/0133472 A1* | 5/2016 | Kim | H01L 21/28088 438/283 |
| 2017/0148792 A1 | 5/2017 | Kim et al. | |
| 2017/0294519 A1* | 10/2017 | Khan | H01L 29/42364 |
| 2019/0088555 A1 | 3/2019 | Xie et al. | |

FOREIGN PATENT DOCUMENTS

| | | |
|---|---|---|
| KR | 20160001092 A | 1/2016 |
| KR | 20170059247 A | 5/2017 |
| TW | 201933543 A | 8/2019 |

* cited by examiner

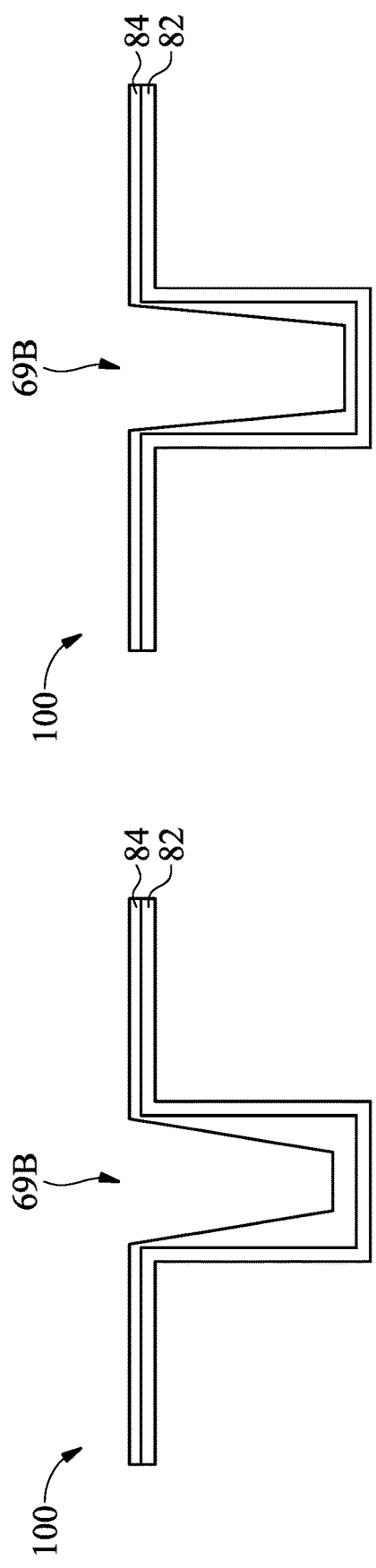
Figure 24
Figure 25
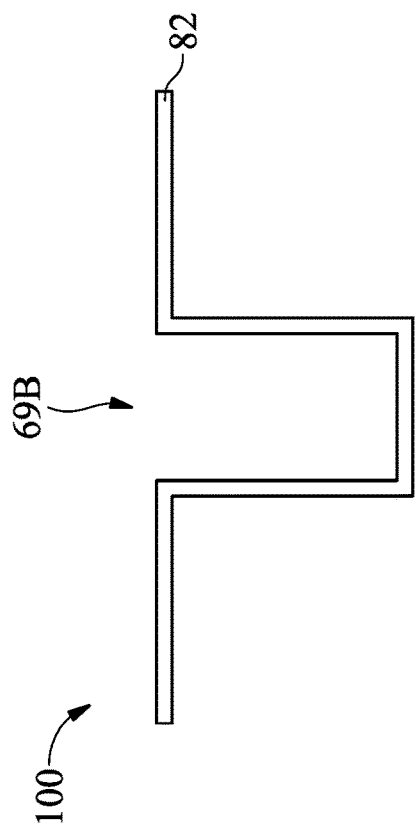
Figure 26

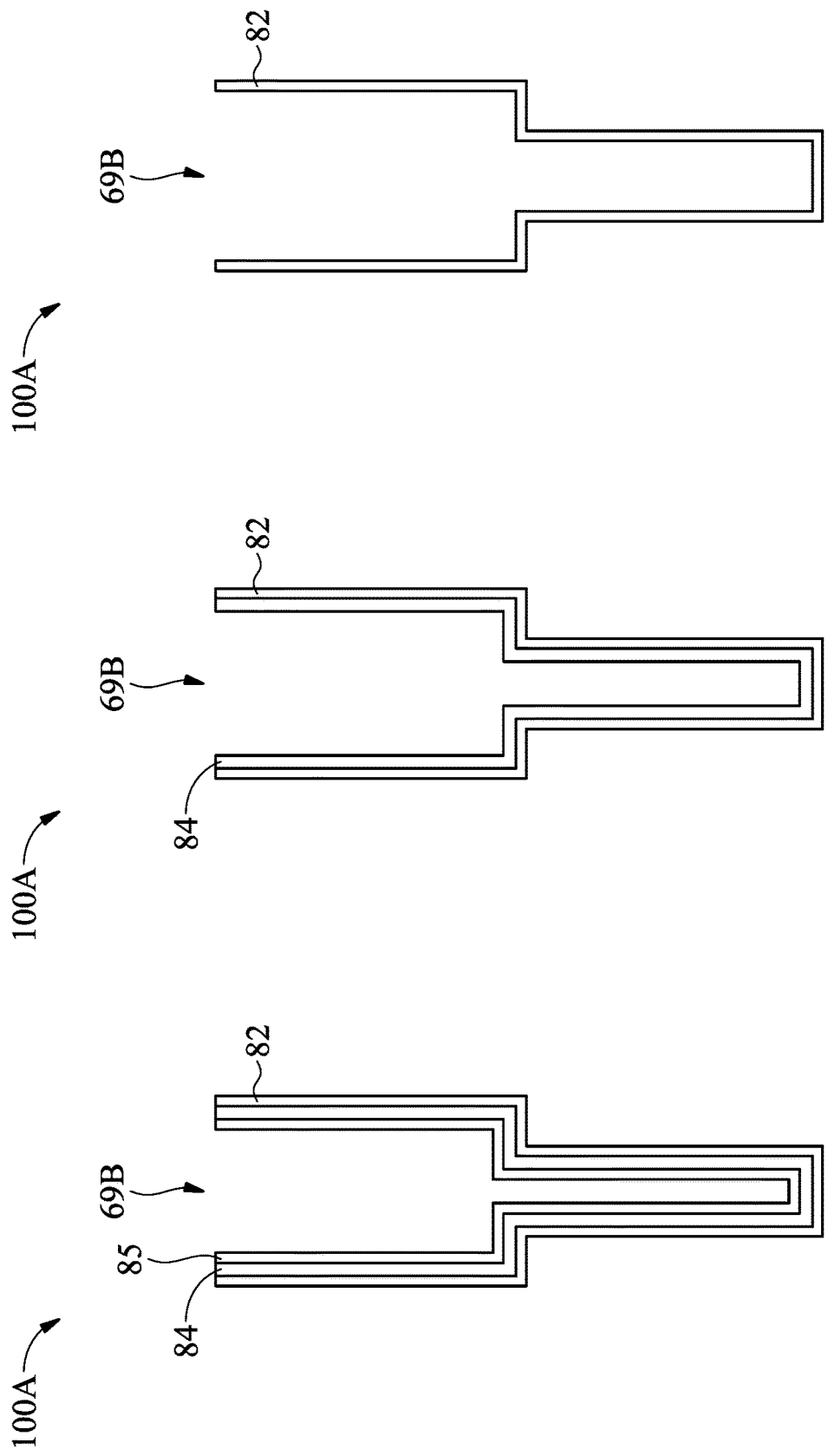

FIN FIELD-EFFECT TRANSISTOR DEVICE AND METHOD OF FORMING THE SAME

BACKGROUND

The semiconductor industry has experienced rapid growth due to continuous improvements in the integration density of a variety of electronic components (e.g., transistors, diodes, resistors, capacitors, etc.). For the most part, this improvement in integration density has come from repeated reductions in minimum feature size, which allows more components to be integrated into a given area.

Fin Field-Effect Transistor (FinFET) devices are becoming commonly used in integrated circuits. FinFET devices have a three-dimensional structure that comprises a semiconductor fin protruding from a substrate. A gate structure, configured to control the flow of charge carriers within a conductive channel of the FinFET device, wraps around the semiconductor fin. For example, in a tri-gate FinFET device, the gate structure wraps around three sides of the semiconductor fin, thereby forming conductive channels on three sides of the semiconductor fin.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 20-26 illustrate cross-sectional views of a semiconductor device at various stages of fabrication, in an embodiment.

FIGS. 27-29 illustrate cross-sectional views of a semiconductor device at various stages of fabrication, in an embodiment.

DETAILED DESCRIPTION

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly. Throughout the discussion herein, unless otherwise specified, the same or similar reference number in different figures refers to the same or similar component formed by a same or similar formation method(s).

Embodiments of the present disclosure are discussed in the context of forming a FinFET device, and in particular, in the context of forming work function layers of a FinFET device. Although the disclosed embodiments are discussed using FinFET devices as examples, the disclosed method may also be used in other types of devices, such as planar devices.

Figure 1:
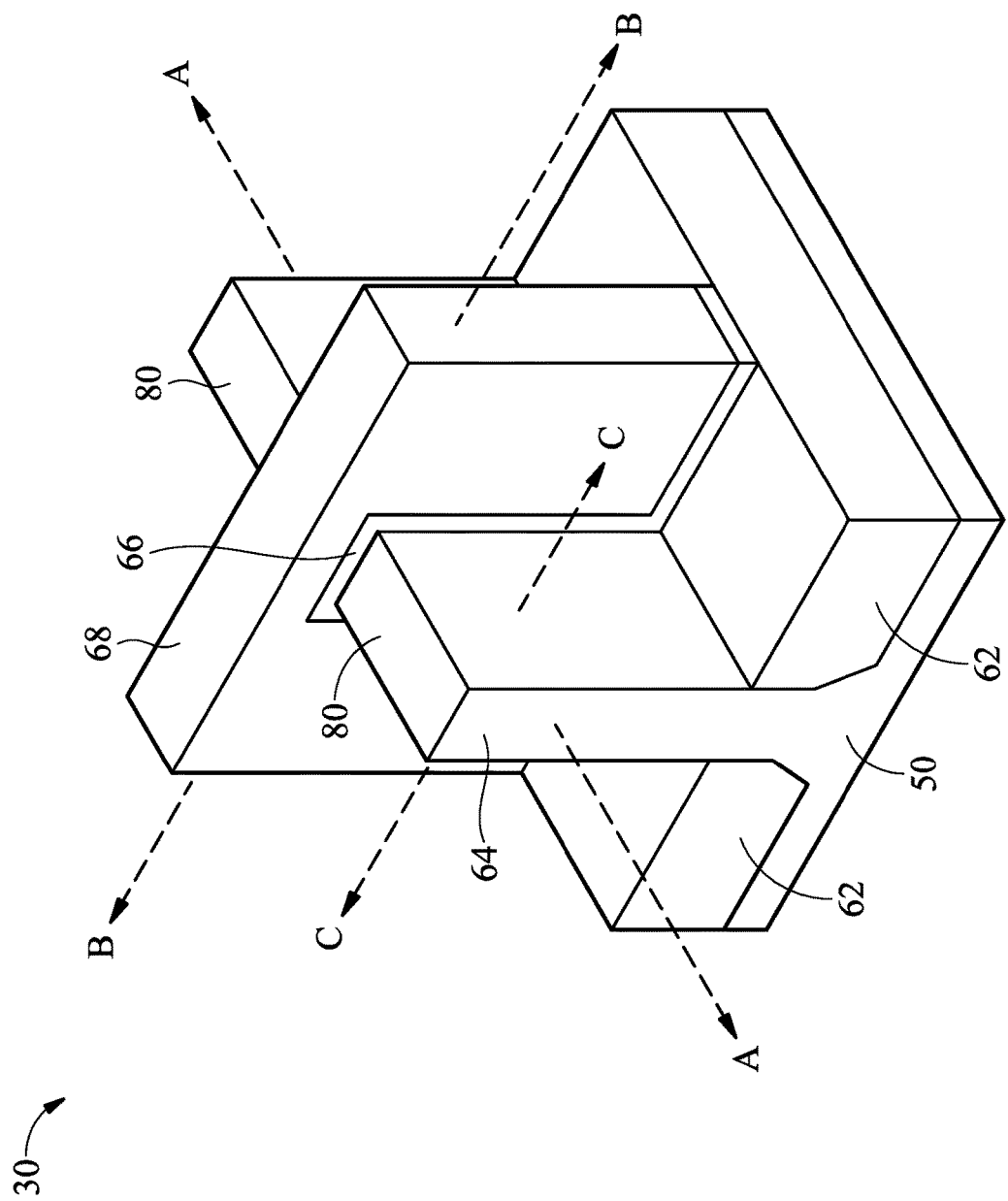
FIG. 1 illustrates a perspective view of a Fin Field-Effect Transistor (FinFET) device, in accordance with some embodiments.

FIG. 1 illustrates an example of a FinFET 30 in a perspective view. The FinFET 30 includes a substrate 50 and a fin 64 protruding above the substrate 50. Isolation regions 62 are formed on opposing sides of the fin 64, with the fin 64 protruding above the isolation regions 62. A gate dielectric 66 is along sidewalls and over a top surface of the fin 64, and a gate 68 is over the gate dielectric 66. Source/drain regions 80 are in the fin 64 and on opposing sides of the gate dielectric 66 and the gate 68. FIG. 1 further illustrates reference cross-sections that are used in later figures. Cross-section B-B extends along a longitudinal axis of the gate 68 of the FinFET 30. Cross-section A-A is perpendicular to cross-section B-B and is along a longitudinal axis of the fin 64 and in a direction of, for example, a current flow between the source/drain regions 80. Cross-section C-C is parallel to cross-section B-B and is across the source/drain region 80. Subsequent figures refer to these reference cross-sections for clarity.

FIGS. 2-6, 7A, 8-19 are cross-sectional views of a FinFET device 100 at various stages of fabrication in accordance with an embodiment. The FinFET device 100 is similar to the FinFET 30 in FIG. 1, but with multiple fins and multiple gate structures. FIGS. 2-5 illustrate cross-sectional views of the FinFET device 100 along cross-section B-B. FIGS. 6, 7A, and 8-19 illustrate cross-sectional views of the FinFET device 100 along cross-section A-A. FIGS. 7B and 7C illustrate various embodiment cross-sectional views of the FinFET device 100 of FIG. 7A, but along cross-section C-C.

Figure 2:
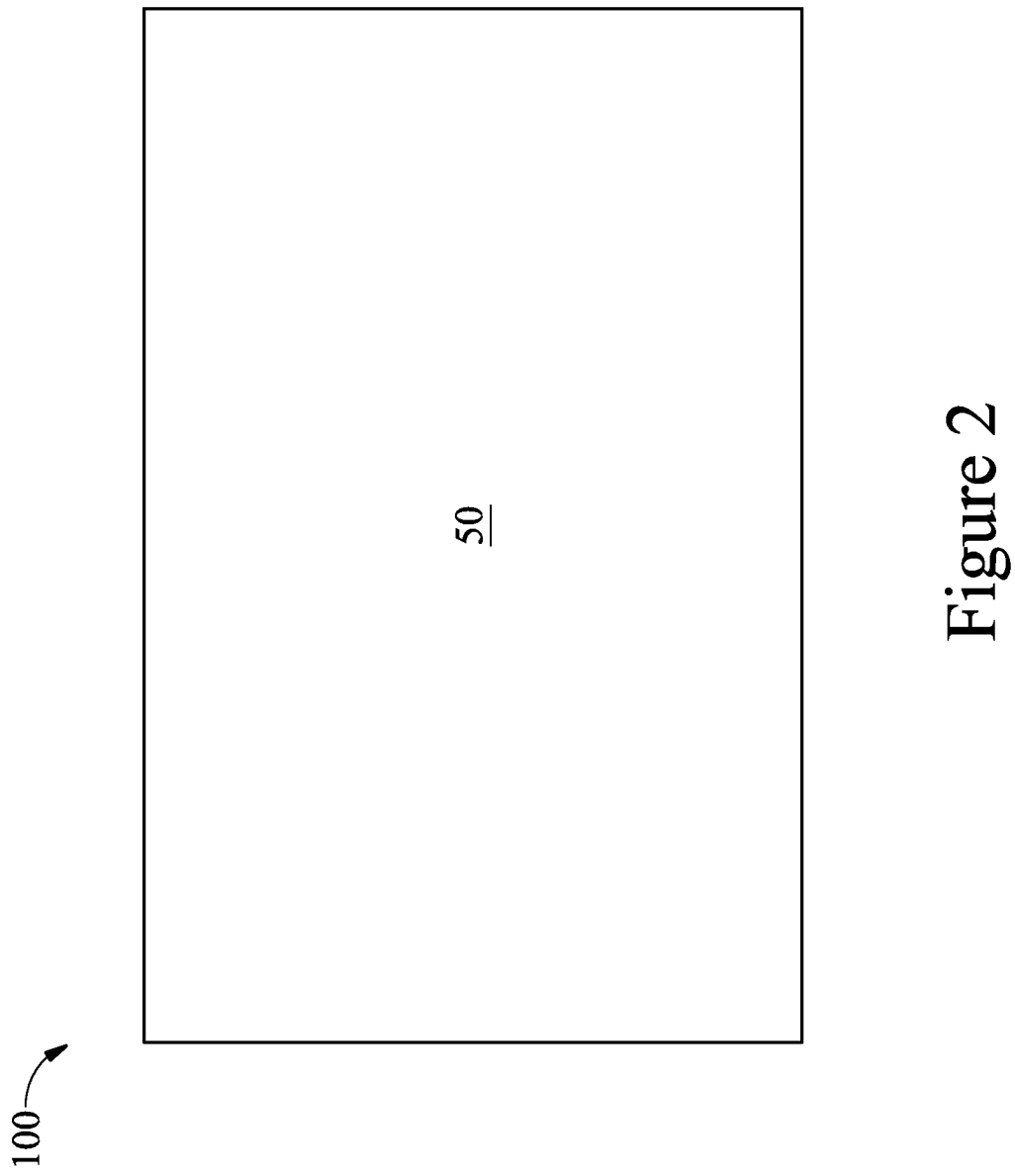
FIGS. 2-6 and 7A illustrate cross-sectional views of a FinFET device at various stages of fabrication, in accordance with an embodiment.

FIG. 2 illustrates a cross-sectional view of the substrate 50. The substrate 50 may be a semiconductor substrate, such as a bulk semiconductor, a semiconductor-on-insulator (SOI) substrate, or the like, which may be doped (e.g., with a P-type or an N-type dopant) or undoped. The substrate 50 may be a wafer, such as a silicon wafer. Generally, an SOI substrate includes a layer of a semiconductor material formed on an insulator layer. The insulator layer may be, for example, a buried oxide (BOX) layer, a silicon oxide layer, or the like. The insulator layer is provided on a substrate, typically a silicon substrate or a glass substrate. Other substrates, such as a multi-layered or gradient substrate may also be used. In some embodiments, the semiconductor material of the substrate 50 may include silicon; germanium; a compound semiconductor including silicon carbide, gallium arsenic, gallium phosphide, indium phosphide, indium arsenide, and/or indium antimonide; an alloy semiconductor including SiGe, GaAsP, AlInAs, AlGaAs, GaInAs, GaInP, and/or GaInAsP; or combinations thereof.

Figure 3:
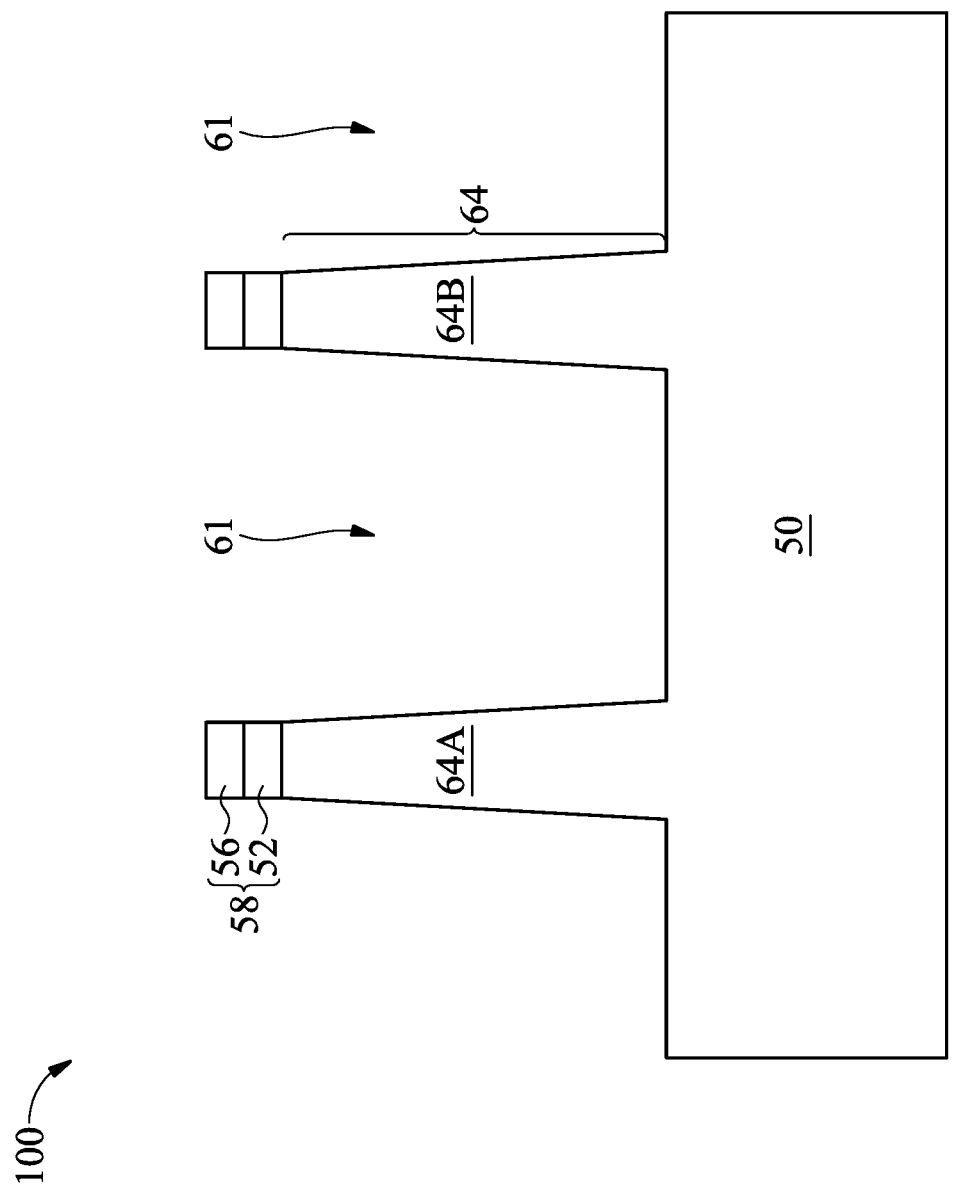

Referring to FIG. 3, the substrate 50 shown in FIG. 2 is patterned using, for example, photolithography and etching techniques. For example, a mask layer, such as a pad oxide layer 52 and an overlying pad nitride layer 56, is formed over the substrate 50. The pad oxide layer 52 may be a thin film comprising silicon oxide formed, for example, using a thermal oxidation process. The pad oxide layer 52 may act as an adhesion layer between the substrate 50 and the overlying pad nitride layer 56. In some embodiments, the pad nitride layer 56 is formed of silicon nitride, silicon oxynitride, silicon carbonitride, the like, or a combination thereof, and may be formed using low-pressure chemical vapor deposition (LPCVD) or plasma enhanced chemical vapor deposition (PECVD), as examples.

The mask layer may be patterned using photolithography techniques. Generally, photolithography techniques utilize a photoresist material that is deposited, irradiated (exposed), and developed to remove a portion of the photoresist material. The remaining photoresist material protects the underlying material, such as the mask layer in this example, from subsequent processing steps, such as etching. In this example, the photoresist material is used to pattern the pad oxide layer 52 and pad nitride layer 56 to form a patterned mask 58, as illustrated in FIG. 3.

The patterned mask 58 is subsequently used to pattern exposed portions of the substrate 50 to form trenches 61, thereby defining semiconductor fins 64 (e.g., 64A and 64B) between adjacent trenches 61 as illustrated in FIG. 3. In some embodiments, the semiconductor fins 64 are formed by etching trenches in the substrate 50 using, for example, reactive ion etch (RIE), neutral beam etch (NBE), the like, or a combination thereof. The etch may be anisotropic. In some embodiments, the trenches 61 may be strips (viewed from in the top) parallel to each other, and closely spaced with respect to each other. In some embodiments, the trenches 61 may be continuous and surround the semiconductor fins 64. The semiconductor fins 64 may also be referred to as fins 64 hereinafter.

The fins 64 may be patterned by any suitable method. For example, the fins 64 may be patterned using one or more photolithography processes, including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in one embodiment, a sacrificial layer is formed over a substrate and patterned using a photolithography process. Spacers are formed alongside the patterned sacrificial layer using a self-aligned process. The sacrificial layer is then removed, and the remaining spacers, or mandrels, may then be used to pattern the fins.

Figure 4:
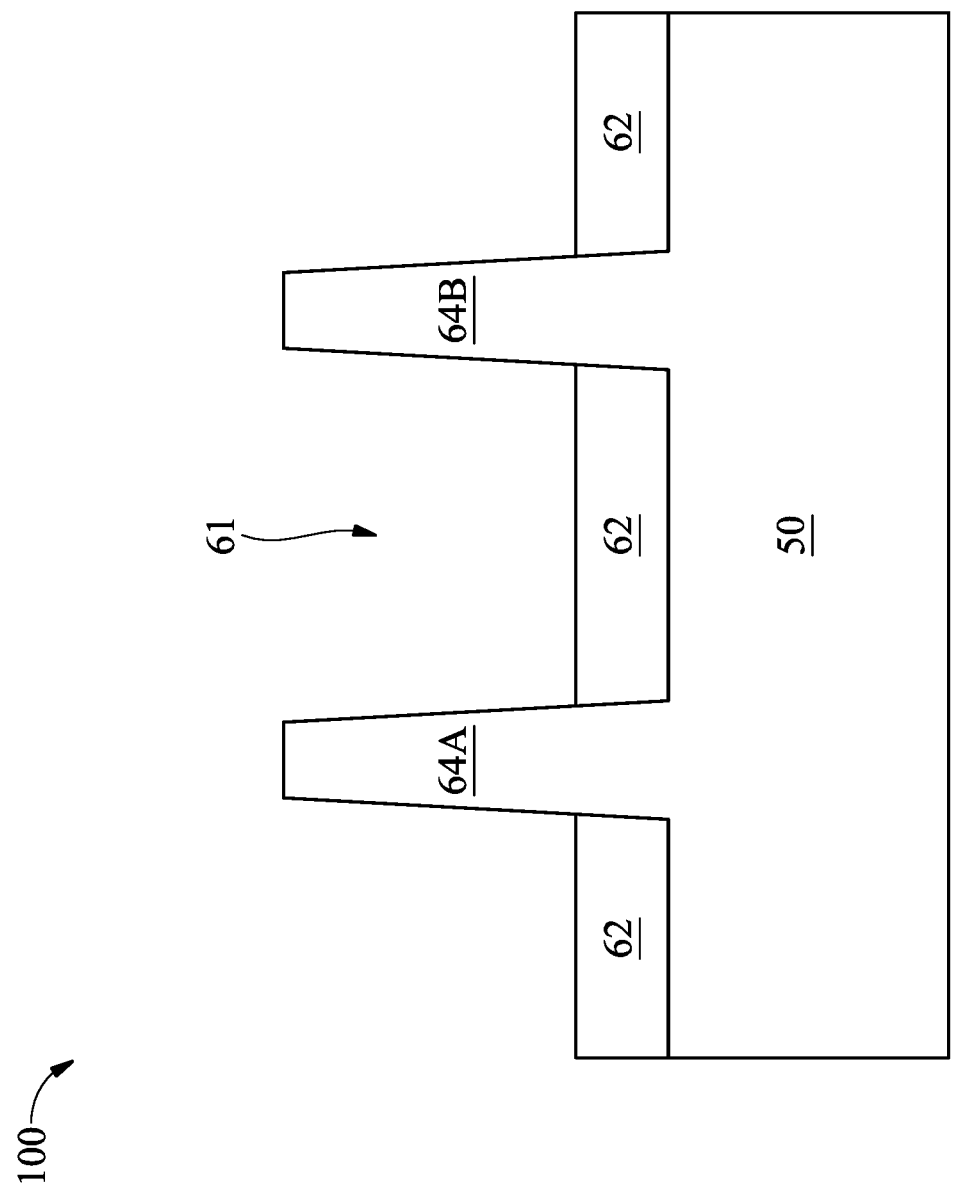

FIG. 4 illustrates the formation of an insulation material between neighboring semiconductor fins 64 to form isolation regions 62. The insulation material may be an oxide, such as silicon oxide, a nitride, the like, or a combination thereof, and may be formed by a high density plasma chemical vapor deposition (HDP-CVD), a flowable CVD (FCVD) (e.g., a CVD-based material deposition in a remote plasma system and post curing to make it convert to another material, such as an oxide), the like, or a combination thereof. Other insulation materials and/or other formation processes may be used. In the illustrated embodiment, the insulation material is silicon oxide formed by a FCVD process. An anneal process may be performed once the insulation material is formed. A planarization process, such as a chemical mechanical polish (CMP), may remove any excess insulation material and form top surfaces of the isolation regions 62 and top surfaces of the semiconductor fins 64 that are coplanar (not shown). The patterned mask 58 (see FIG. 3) may also be removed by the planarization process.

In some embodiments, the isolation regions 62 include a liner, e.g., a liner oxide (not shown), at the interface between the isolation region 62 and the substrate 50/semiconductor fins 64. In some embodiments, the liner oxide is formed to reduce crystalline defects at the interface between the substrate 50 and the isolation region 62. Similarly, the liner oxide may also be used to reduce crystalline defects at the interface between the semiconductor fins 64 and the isolation region 62. The liner oxide (e.g., silicon oxide) may be a thermal oxide formed through a thermal oxidation of a surface layer of substrate 50, although other suitable method may also be used to form the liner oxide.

Next, the isolation regions 62 are recessed to form shallow trench isolation (STI) regions 62. The isolation regions 62 are recessed such that the upper portions of the semiconductor fins 64 protrude from between neighboring STI regions 62. The top surfaces of the STI regions 62 may have a flat surface (as illustrated), a convex surface, a concave surface (such as dishing), or a combination thereof. The top surfaces of the STI regions 62 may be formed flat, convex, and/or concave by an appropriate etch. The isolation regions 62 may be recessed using an acceptable etching process, such as one that is selective to the material of the isolation regions 62. For example, a dry etch or a wet etch using dilute hydrofluoric (dHF) acid may be performed to recess the isolation regions 62.

FIGS. 2 through 4 illustrate an embodiment of forming fins 64, but fins may be formed in various different processes. For example, a top portion of the substrate 50 may be replaced by a suitable material, such as an epitaxial material suitable for an intended type (e.g., N-type or P-type) of semiconductor devices to be formed. Thereafter, the substrate 50, with epitaxial material on top, is patterned to form semiconductor fins 64 that comprise the epitaxial material.

As another example, a dielectric layer can be formed over a top surface of a substrate; trenches can be etched through the dielectric layer; homoepitaxial structures can be epitaxially grown in the trenches; and the dielectric layer can be recessed such that the homoepitaxial structures protrude from the dielectric layer to form fins.

In yet another example, a dielectric layer can be formed over a top surface of a substrate; trenches can be etched through the dielectric layer; heteroepitaxial structures can be epitaxially grown in the trenches using a material different from the substrate; and the dielectric layer can be recessed such that the heteroepitaxial structures protrude from the dielectric layer to form fins.

In embodiments where epitaxial material(s) or epitaxial structures (e.g., the heteroepitaxial structures or the homoepitaxial structures) are grown, the grown material(s) or structures may be in situ doped during growth, which may obviate prior and subsequent implantations although in situ and implantation doping may be used together. Still further, it may be advantageous to epitaxially grow a material in an NMOS region different from the material in a PMOS region. In various embodiments, the fins 64 may comprise silicon germanium ($Si_xGe_{1-x}$, where x can be between 0 and 1), silicon carbide, pure or substantially pure germanium, a III-V compound semiconductor, a II-VI compound semiconductor, or the like. For example, the available materials for forming III-V compound semiconductor include, but are not limited to, InAs, AlAs, GaAs, InP, GaN, InGaAs, InAlAs, GaSb, AlSb, AlP, GaP, and the like.

Figure 5:
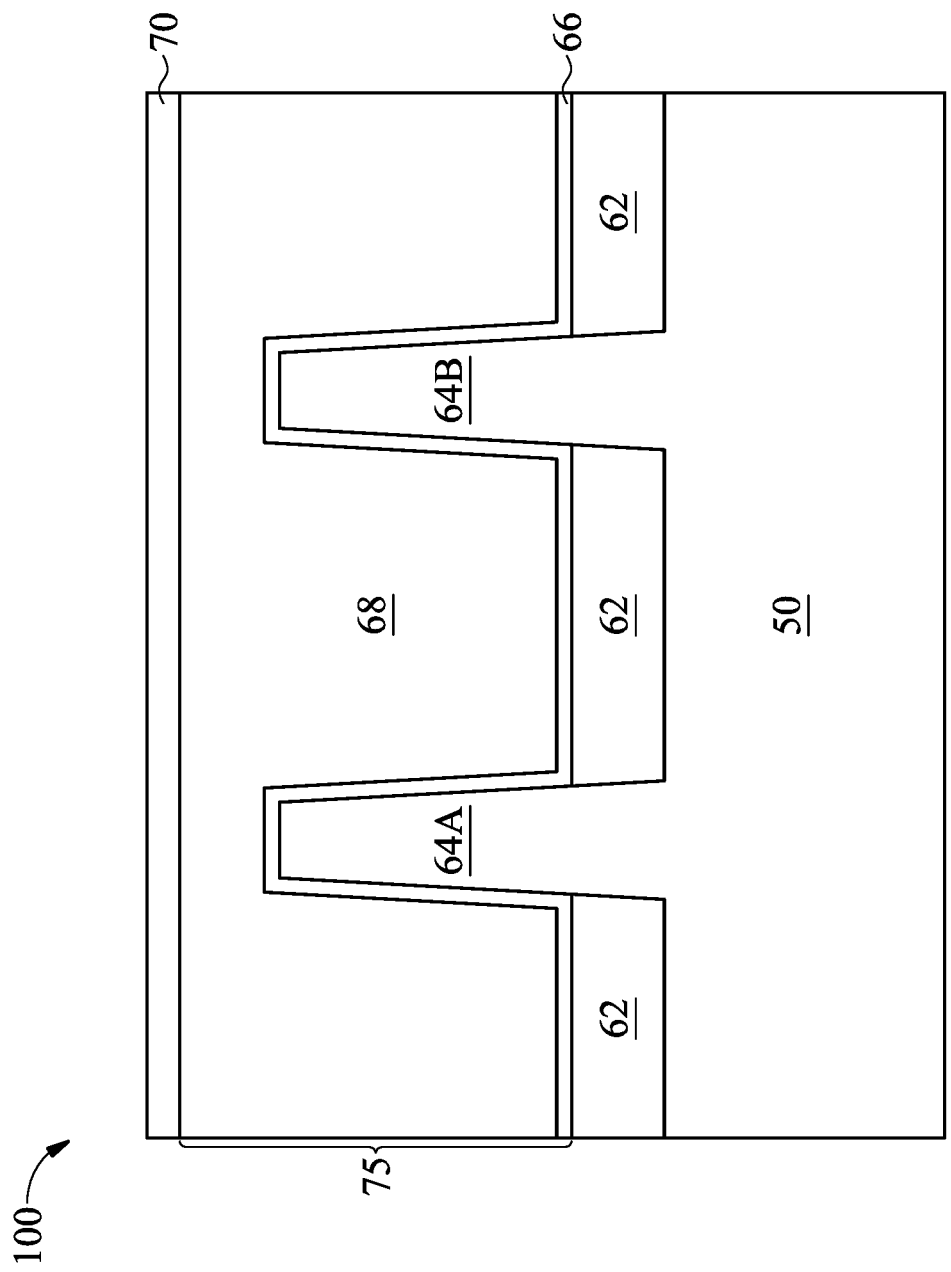

FIG. 5 illustrates the formation of dummy gate structure 75 over the semiconductor fins 64. Dummy gate structure 75 includes gate dielectric 66 and gate 68, in some embodiments. A mask 70 may be formed over the dummy gate structure 75. To form the dummy gate structure 75, a dielectric layer is formed on the semiconductor fins 64. The dielectric layer may be, for example, silicon oxide, silicon nitride, multilayers thereof, or the like, and may be deposited or thermally grown.

A gate layer is formed over the dielectric layer, and a mask layer is formed over the gate layer. The gate layer may be deposited over the dielectric layer and then planarized, such as by a CMP. The mask layer may be deposited over the gate layer. The gate layer may be formed of, for example, polysilicon, although other materials may also be used. The mask layer may be formed of, for example, silicon nitride or the like.

After the layers (e.g., the dielectric layer, the gate layer, and the mask layer) are formed, the mask layer may be patterned using acceptable photolithography and etching techniques to form mask 70. The pattern of the mask 70 then may be transferred to the gate layer and the dielectric layer by an acceptable etching technique to form gate 68 and gate dielectric 66, respectively. The gate 68 and the gate dielectric 66 cover respective channel regions of the semiconductor fins 64. The gate 68 may also have a lengthwise direction substantially perpendicular to the lengthwise direction of respective semiconductor fins 64.

The gate dielectric 66 is shown to be formed over the fins 64 (e.g., over top surfaces and sidewalls of the fins 64) and over the STI regions 62 in the example of FIG. 5. In other embodiments, the gate dielectric 66 may be formed by, e.g., thermal oxidization of a material of the fins 64, and therefore, may be formed over the fins 64 but not over the STI regions 62. These and other variations are fully intended to be included within the scope of the present disclosure.

FIGS. 6, 7A, and 8-19 illustrate the cross-sectional views of further processing of the FinFET device 100 along cross-section A-A (along a longitudinal axis of the fin 64). FIGS. 7B and 7C illustrate various embodiment cross-sectional views of the FinFET device 100 of FIG. 7A, but along cross-section C-C. Note that in FIGS. 6, 7A, and 8, four dummy gate structures 75 (e.g., 75A, 75B, 75C, and 75D) are formed over the fin 64. One skilled in the art will appreciate that more or less than four gate structures may be formed over the fin 64, these and other variations are fully intended to be included within the scope of the present disclosure.

Figure 6:
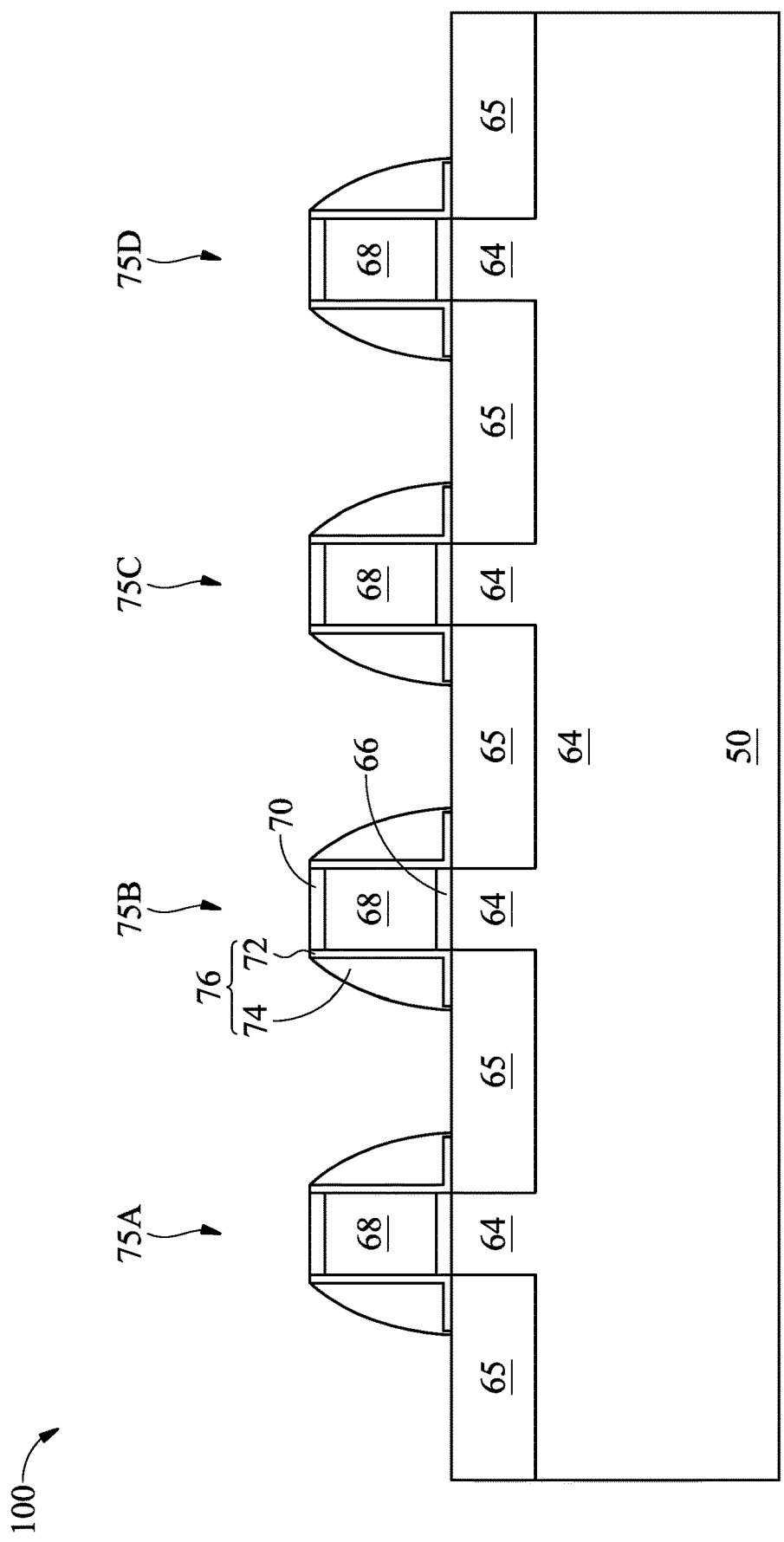

As illustrated in FIG. 6, lightly doped drain (LDD) regions 65 are formed in the fins 64. The LDD regions 65 may be formed by a plasma doping process. The plasma doping process may include forming and patterning masks such as a photoresist to cover the regions of the FinFET that are to be protected from the plasma doping process. The plasma doping process may implant N-type or P-type impurities in the fins 64 to form the LDD regions 65. For example, P-type impurities, such as boron, may be implanted in the fin 64 to form the LDD regions 65 for a P-type device. As another example, N-type impurities, such as phosphorus, may be implanted in the fin 64 to form the LDD regions 65 for an N-type device. In some embodiments, the LDD regions 65 abut the channel region of the FinFET device 100. Portions of the LDD regions 65 may extend under gate 68 and into the channel region of the FinFET device 100. FIG. 6 illustrates a non-limiting example of the LDD regions 65. Other configurations, shapes, and formation methods of the LDD regions 65 are also possible and are fully intended to be included within the scope of the present disclosure. For example, LDD regions 65 may be formed after gate spacers 76 are formed. In some embodiments, the LDD regions 65 are omitted.

Still referring to FIG. 6, after the LDD regions 65 are formed, a gate spacer 76 is formed on the gate structure. The gate spacer 76 may include a first gate spacer 72 and a second gate spacer 74. For example, the first gate spacer 72 may be a gate seal spacer and is formed on opposing sidewalls of the gate 68 and on opposing sidewalls of the gate dielectric 66. The second gate spacer 74 is formed on the first gate spacer 72. The first gate spacer 72 may be formed of silicon nitride, silicon oxynitride, silicon carbide, silicon carbonitride, the like, or a combination thereof, and may be formed using, e.g., a thermal oxidation, chemical vapor deposition (CVD), or other suitable deposition process. The second gate spacer 74 may be formed of silicon nitride, silicon carbonitride, a combination thereof, or the like using a suitable deposition method.

In an example embodiment, the gate spacer 76 is formed by first conformally depositing a first gate spacer layer over the FinFET device 100, then conformally depositing a second gate spacer layer over the deposited first gate spacer layer. Next, an anisotropic etch process, such as a dry etch process, is performed to remove a first portion of the second gate spacer layer disposed on upper surfaces of the FinFET device 100 (e.g., the upper surface of the mask 70) while keeping a second portion of the second gate spacer layer disposed along sidewalls of the dummy gate structures 75. The second portion of the second gate spacer layer remaining after the anisotropic etch process forms the second gate spacer 74. The anisotropic etch process also removes a portion of the first gate spacer layer disposed outside of the sidewalls of the second gate spacer 74, and the remaining portion of the first gate spacer layer forms the first gate spacer 72.

The shapes and formation methods of the gate spacer 76 as illustrated in FIG. 6 are merely non-limiting examples, and other shapes and formation methods are possible. These and other variations are fully intended to be included within the scope of the present disclosure.

Figure 7A:
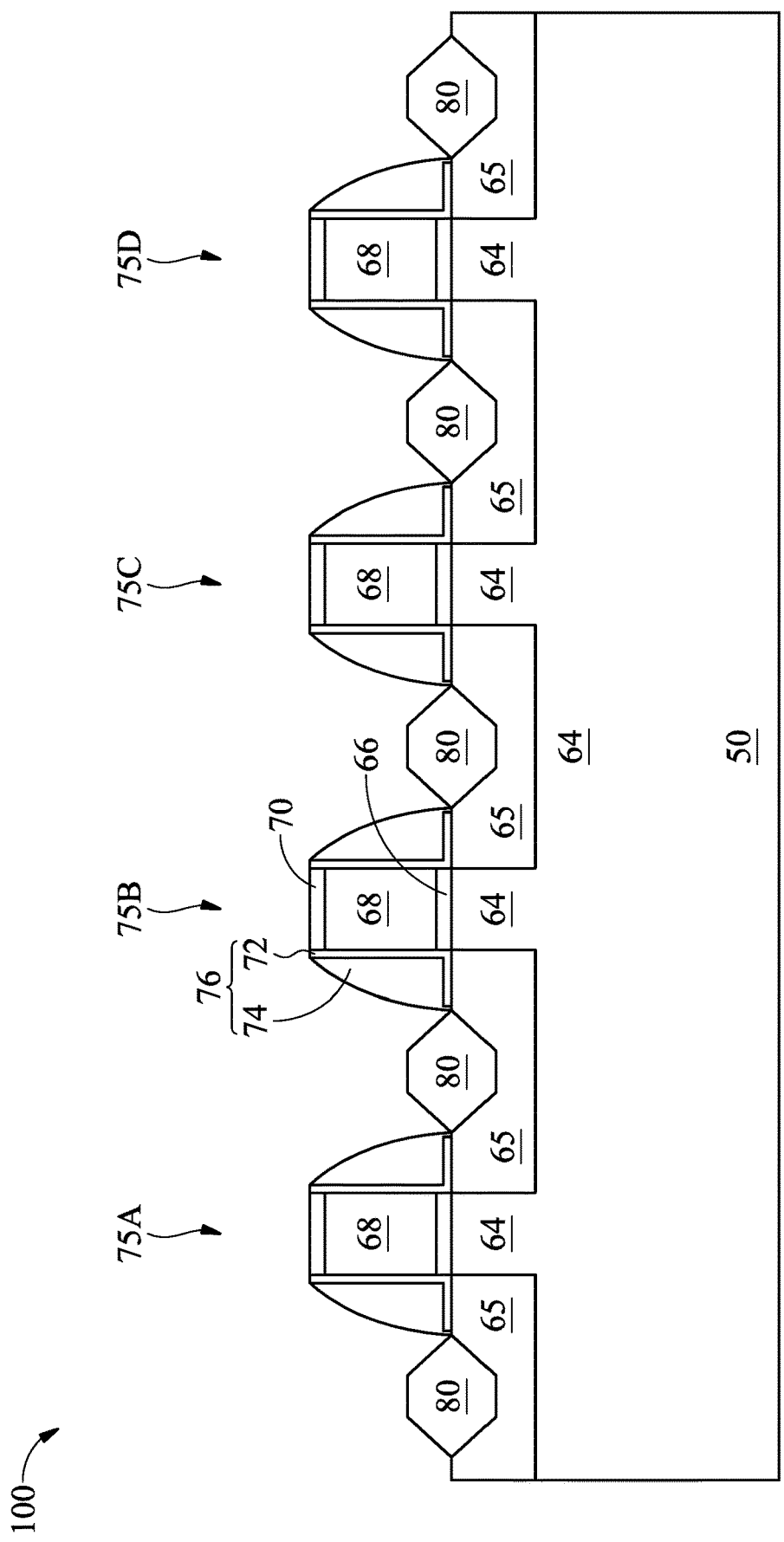
Figure 7B:
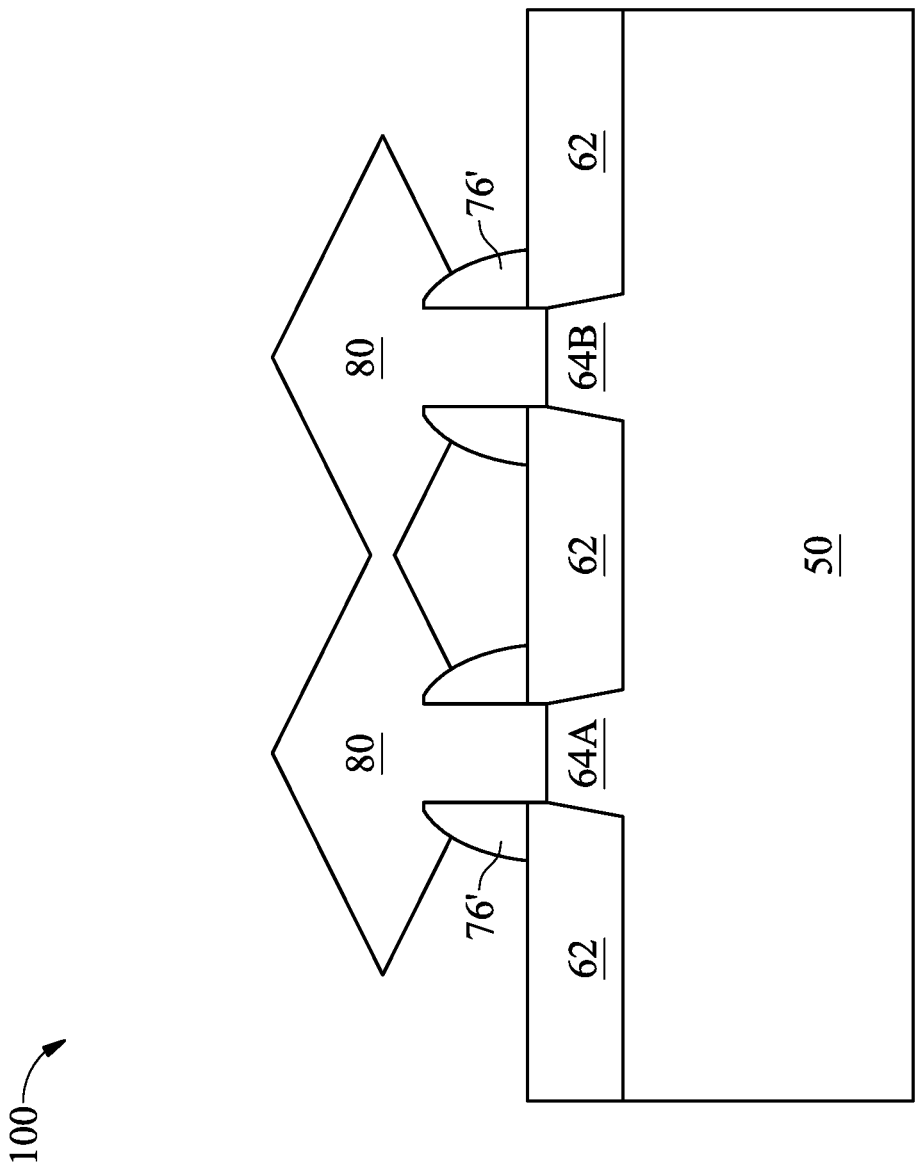
FIGS. 7B and 7C illustrate various cross-sectional views of the semiconductor device illustrated in FIG. 7A, in some embodiments.
Figure 7C:
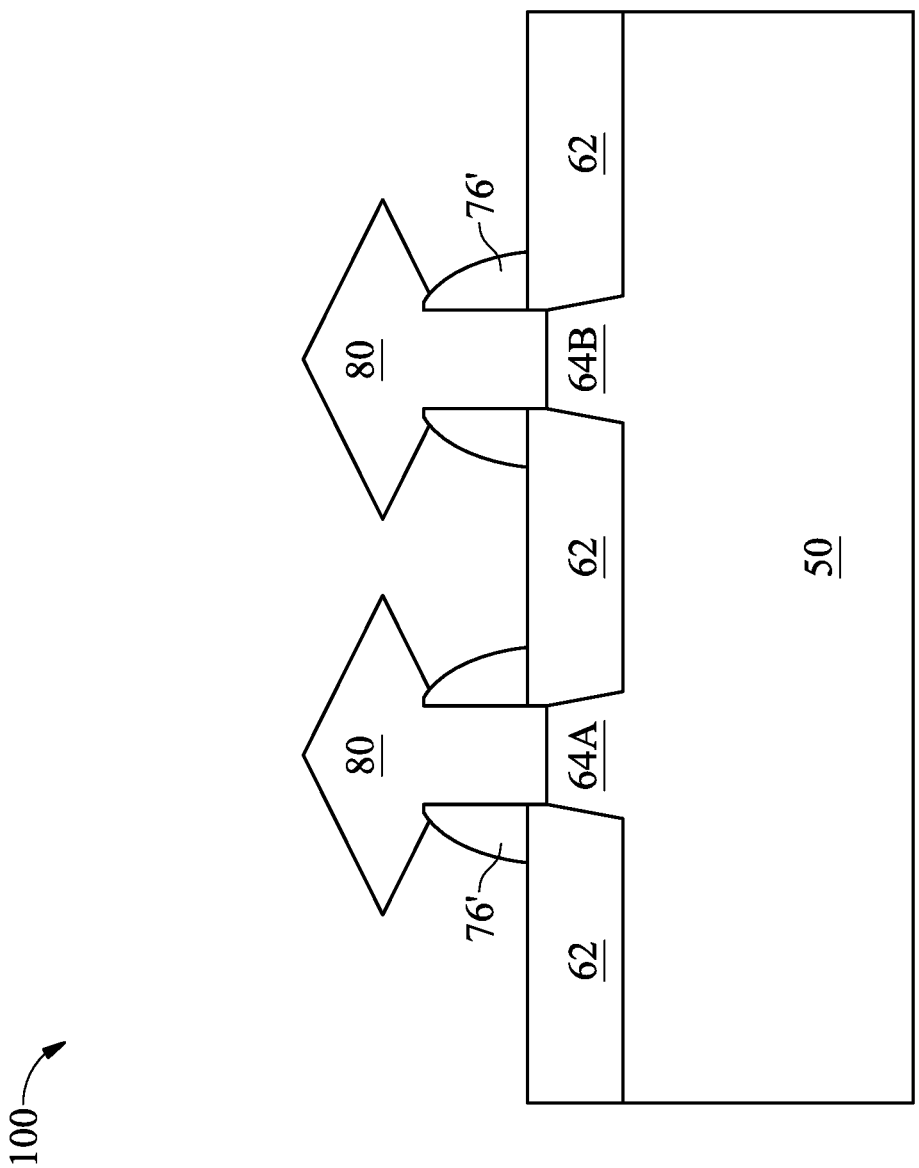

Next, as illustrated in FIG. 7A, source/drain regions 80 are formed. The source/drain regions 80 are formed by etching the fins 64 (e.g., in the LDD region 65) to form recesses, and epitaxially growing a material in the recess, using suitable methods such as metal-organic CVD (MOCVD), molecular beam epitaxy (MBE), liquid phase epitaxy (LPE), vapor phase epitaxy (VPE), selective epitaxial growth (SEG), the like, or a combination thereof.

As illustrated in FIG. 7A, the epitaxial source/drain regions 80 may have surfaces raised from respective surfaces of the fins 64 (e.g. raised above the non-recessed portions of the fins 64) and may have facets. The source/drain regions 80 of the adjacent fins 64 may merge to form a continuous epitaxial source/drain region 80 (see FIG. 7B). In some embodiments, the source/drain regions 80 for adjacent fins 64 do not merge together and remain separate source/drain regions 80 (see FIG. 7C). FIGS. 7A and 7B also illustrate spacers 76' along opposing sidewalls of the fins 64, which spacers 76' may have a same or similar structure as the gate spacers 76, and may be formed in a same processing step(s) as the gate spacers 76.

The epitaxial source/drain regions 80 may be implanted with dopants to form source/drain regions 80 followed by an anneal process. The implanting process may include forming and patterning masks such as a photoresist to cover the regions of the FinFET that are to be protected from the implanting process. The source/drain regions 80 may have an impurity (e.g., dopant) concentration in a range from about 1E19 cm$^{-3}$ to about 1E21 cm$^{-3}$. P-type impurities, such as boron or indium, may be implanted in the source/drain region 80 of a P-type transistor. N-type impurities, such as phosphorous or arsenide, may be implanted in the source/drain regions 80 of an N-type transistor. In some embodiments, the epitaxial source/drain regions may be in situ doped during growth.

Figure 8:
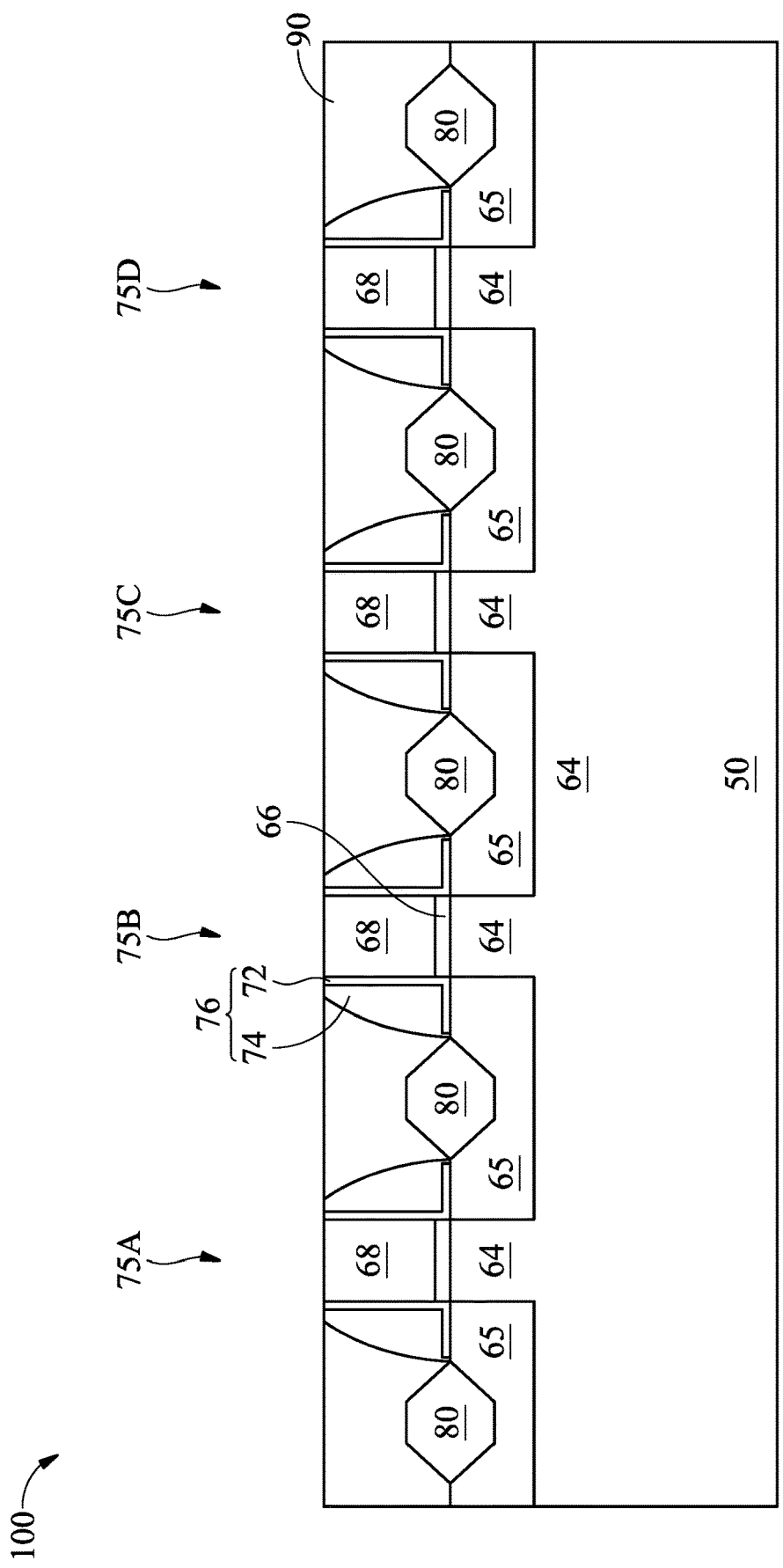
FIGS. 8-19 illustrate cross-sectional views of the FinFET device of FIG. 7A at additional stages of fabrication, in accordance with an embodiment.

Next, in FIG. 8, a first interlayer dielectric (ILD) 90 is formed over the substrate 50 and over the dummy gate structures 75 (e.g., 75A, 75B, 75C, and 75D). In some embodiments, the first ILD 90 is formed of a dielectric material such as silicon oxide, phosphosilicate glass (PSG), borosilicate glass (BSG), boron-doped phosphosilicate Glass (BPSG), undoped silicate glass (USG), or the like, and may be deposited by any suitable method, such as CVD, PECVD, or FCVD. A planarization process, such as a CMP process, may be performed to remove the mask 70 (see FIG. 7A). After the planarization process, the top surface of the first ILD 90 is level with the top surface of the gate 68.

An embodiment gate-last process (sometimes referred to as replacement gate process) is performed subsequently to replace the gate 68 and the gate dielectric 66 with an active gate (may also be referred to as a replacement gate or a metal gate) and active gate dielectric material(s). The active gate may be a metal gate, in some embodiments. Therefore, the gate 68 and the gate dielectric 66 are considered dummy gate structures in a gate-last process.

Figure 9:
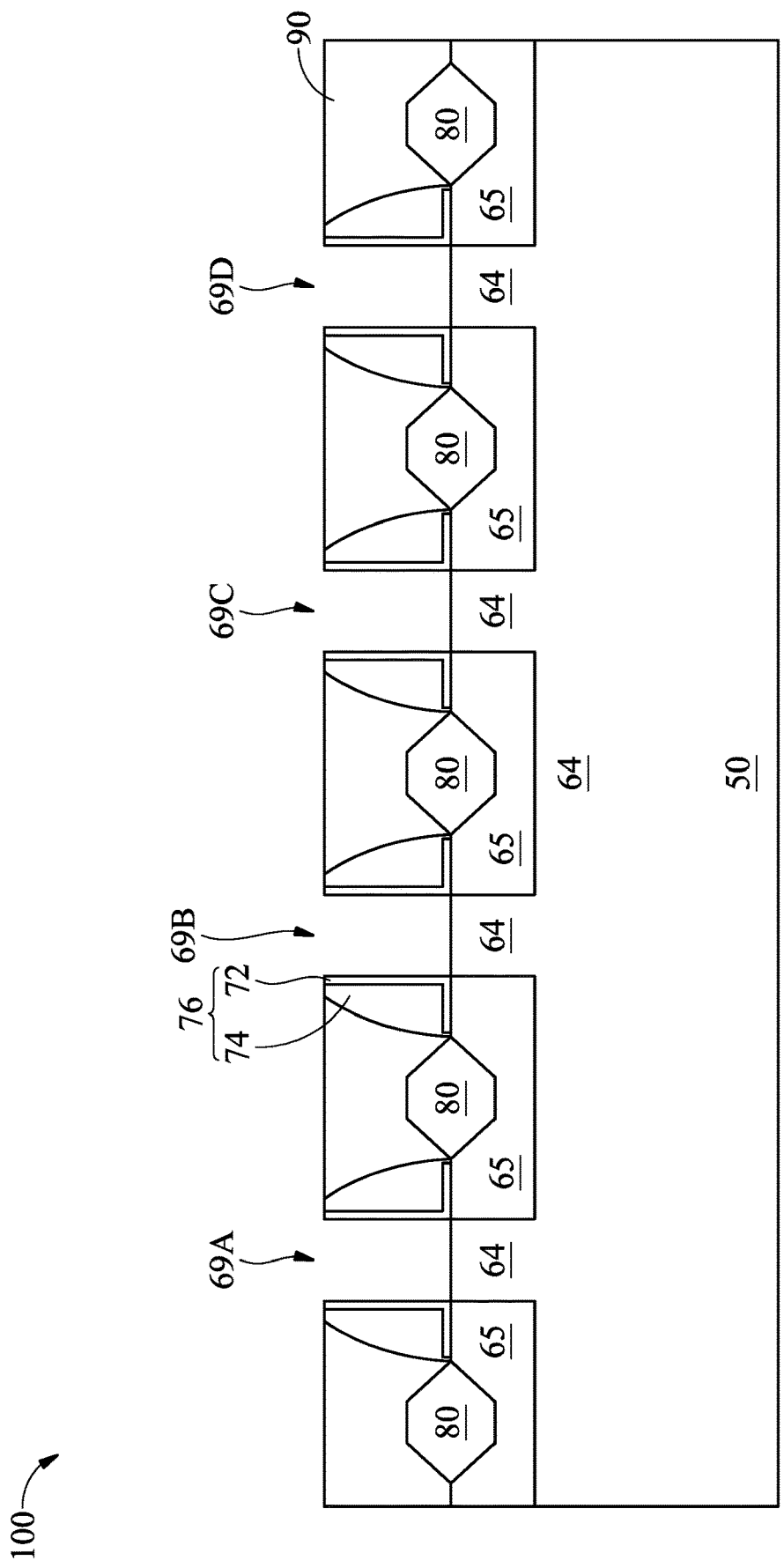

Referring to FIG. 9, the dummy gate structures 75A, 75B, 75C, and 75D are removed to form recesses 69A, 69B, 69C, and 69D, respectively, in the first ILD 90. In accordance with some embodiments, the gates 68 and the gate dielectric 66 directly under the gates 68 are removed in an etching step(s), so that the recesses 69 (e.g., 69A, 69B, 69C, and 69D) are formed between the gate spacers 76. Each recess 69 exposes the channel region of a respective fin 64. During the dummy gate removal, the dummy gate dielectric 66 may be used as an etch stop layer when the dummy gate 68 is etched. The dummy gate dielectric 66 may then be removed after the removal of the dummy gate 68. Since the replacement gates are formed in the recesses 69, the recesses 69 are also referred to as gate trenches 69.

Figure 10:
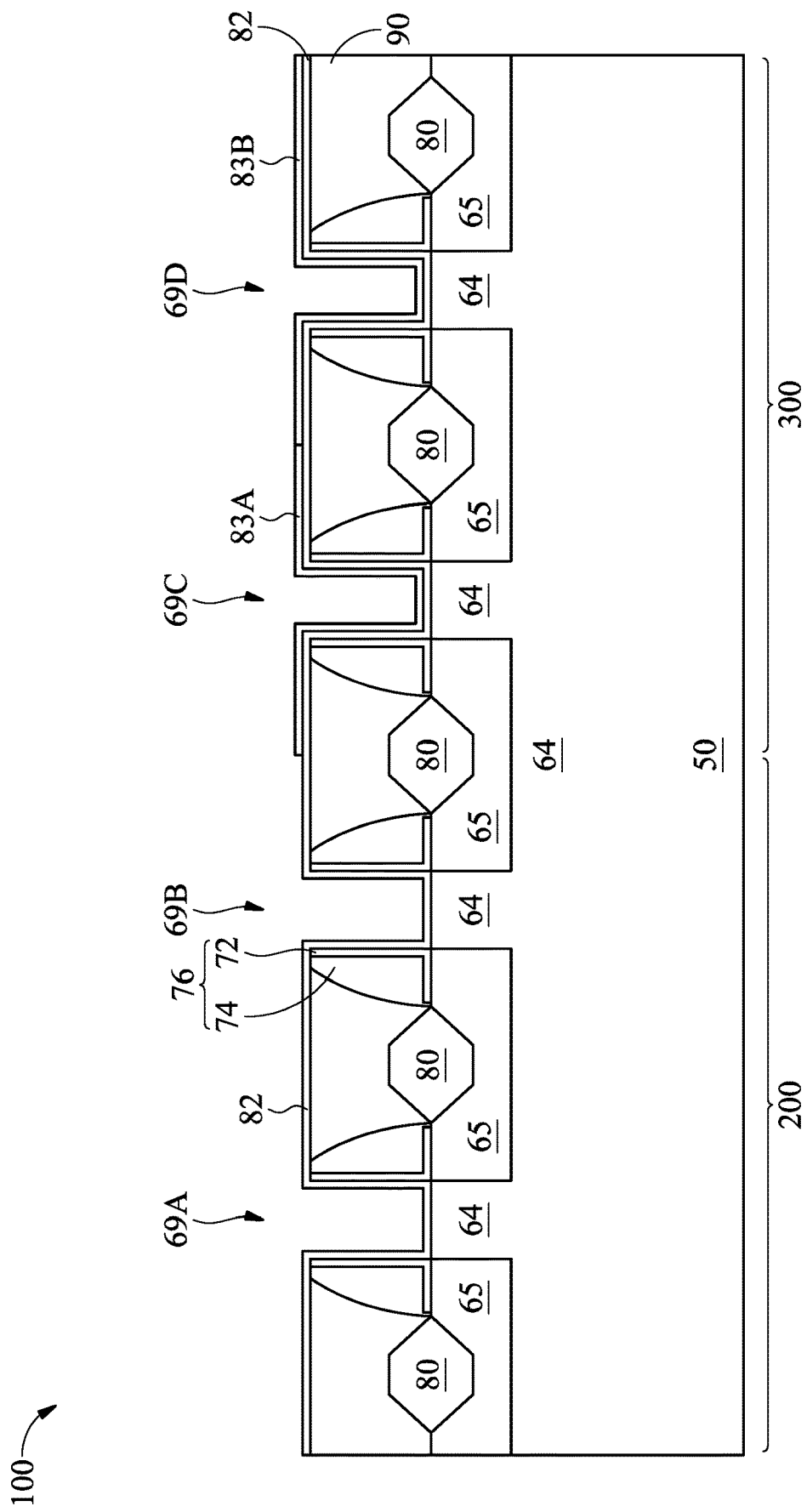

Next, in FIG. 10, a gate dielectric layer 82 is deposited conformally in the recesses 69, such as on top surfaces and sidewalls of the fins 64, on sidewalls of the gate spacers 76, and on a top surface of the first ILD 90. In accordance with some embodiments, the gate dielectric layer 82 comprises silicon oxide, silicon nitride, or multilayers thereof. In other embodiments, the gate dielectric layer 82 includes a high-k dielectric material, and in these embodiments, the gate dielectric layers 82 may have a k value greater than about 7.0, and may include a metal oxide or a silicate of Hf, Al, Zr, La, Mg, Ba, Ti, Pb, and combinations thereof. The formation methods of gate dielectric layer 82 may include molecular beam deposition (MBD), atomic layer deposition (ALD), PECVD, and the like.

In the example of FIG. 10, the fin 64 has a region 200 (e.g., an N-type device region) and a region 300 (e.g., a P-type device region) for forming different types of devices (e.g., N-type transistors or P-type transistors). As illustrated in FIG. 10, after the gate dielectric layer 82 is conformally formed in the regions 200 and 300, a first P-type work function layer 83A and a second P-type work function layer 83B are formed in the region 300. In particular, the first P-type work function layer 83A is conformally formed in the recess 69C and over portions of the upper surface of the first ILD 90 adjacent to the recess 69C. The second P-type work function layer 83B is conformally formed in the recess 69D and over portions of the upper surface of the first ILD 90 adjacent to the recess 69D. In the discussion herein, a P-type work function layer may also be referred to as a P-type work function metal, and an N-type work function layer may also be referred to as an N-type work function metal. The second P-type work function layer 83B is formed of a material (e.g., a P-type work function metal) different from that of the first P-type work function layer 83A, in the illustrated embodiment.

Example P-type work function metals include TiN, TaN, Ru, Mo, Al, WN, ZrSi$_2$, MoSi$_2$, TaSi$_2$, NiSi$_2$, WN, other suitable P-type work function materials, or combinations thereof. Example N-type work function metals include Ti, Ag, TaAl, TaAlC, TiAlN, TaC, TaCN, TaSiN, Mn, Zr, other suitable N-type work function materials, or combinations thereof. A work function value is associated with the material composition of the work function layer, and thus, the material of the work function layer is chosen to tune its work function value so that a target threshold voltage Vt is achieved in the device that is to be formed. The work function layer(s) may be deposited by CVD, physical vapor deposition (PVD), and/or other suitable process.

Each of the first P-type work function layer 83A and the second P-type work function layer 83B in FIG. 10 may be formed by depositing the work function metal and patterning the deposited work function metal. For example, the first P-type work function layer 83A may be formed by conformally depositing a P-type work function metal over the gate dielectric layer 82 (e.g., in the regions 200 and 300), forming a patterned mask layer to expose portions of the P-type work function metal to be removed, performing an etching process to remove the exposed P-type work function metal, and removing the patterned mask layer. After removal of the patterned mask layer, the remaining P-type work function metal forms the first P-type work function layer 83A. Similar process may be performed to form the second P-type work function layer 83B.

Figure 11:
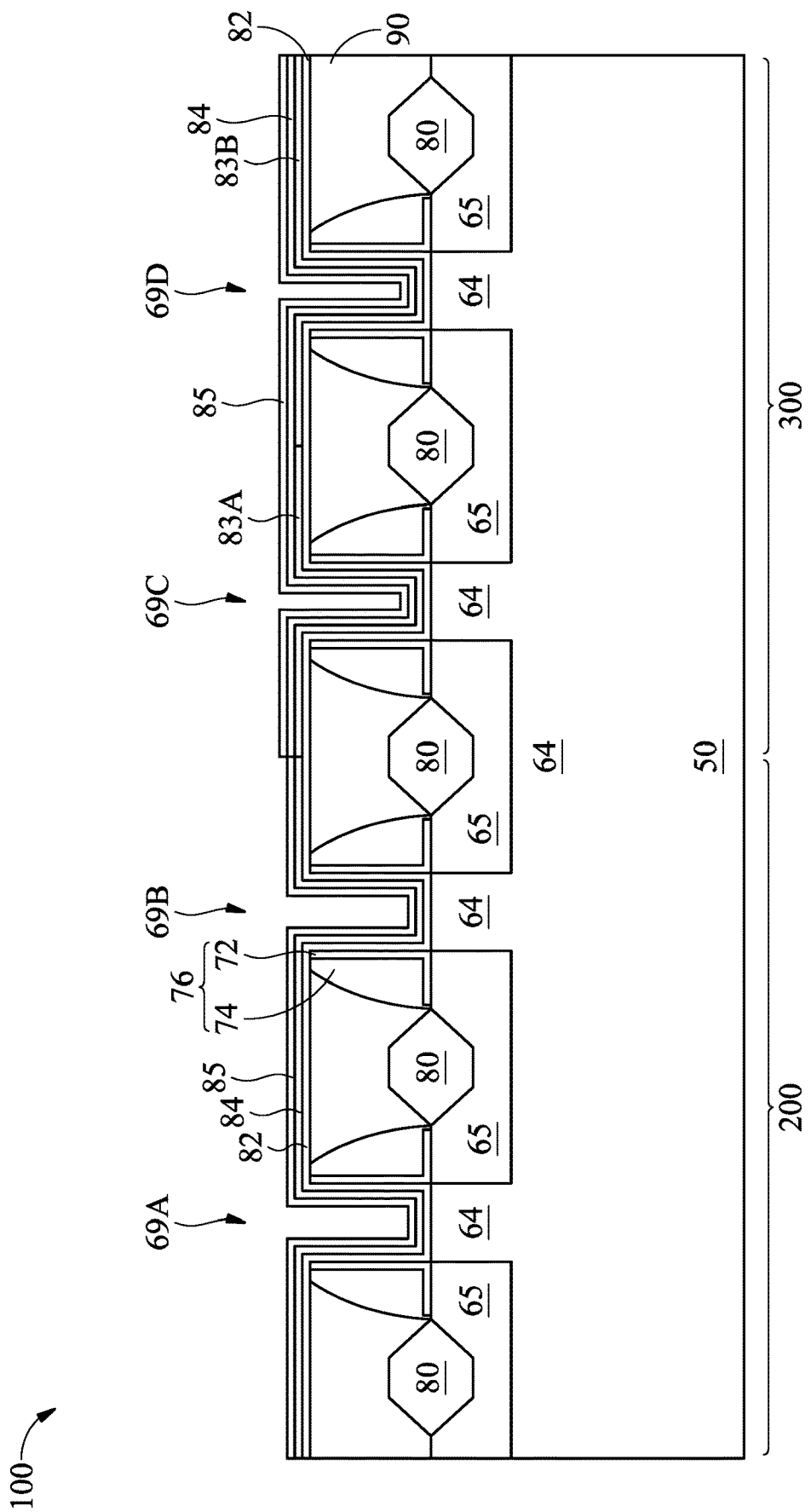

Next, in FIG. 11, an N-type work function layer 84 is formed (e.g., conformally) in the regions 200 and 300. The N-type work function layer 84 may be formed of any suitable N-type work function material, such as titanium aluminum carbon (TiAlC). Any suitable formation method, such as CVD, PVD, ALD, the like, or combinations thereof, may be used to form the N-type work function layer 84. In FIG. 11, the N-type work function layer 84 extends along and physically contacts the gate dielectric layer 82 in the region 200, and extends along and physically contacts the first P-type work function layer 83A and the second P-type work function layer 83B in the region 300. The upper surface of the N-type work function layer 84 in the region 200 may be lower (e.g., closer to the substrate 50) than the upper surface of the N-type work function layer 84 in the region 300, due to the underlying first P-type work function layer 83A and the second P-type work function layer 83B in the region 300.

Next, a capping layer 85 is conformally formed over the N-type work function layer 84 in the regions 200 and 300. The capping layer 85 is formed of titanium nitride, silicon, silicon oxide, silicon oxynitride, or combinations thereof, using a suitable formation method, such as PVD, CVD, ALD, combinations thereof, or the like, in some embodiments. The capping layer 85 protects the underlying work function layers (e.g., 84, 83A, 83B) from being oxidized by oxygen in the ambient. In addition, in a subsequent thermal drive-in process, the capping layer 85 helps to drive the work function metals into the gate dielectric layer 82, thereby improving the efficiency of the thermal drive-in process.

Figure 12:
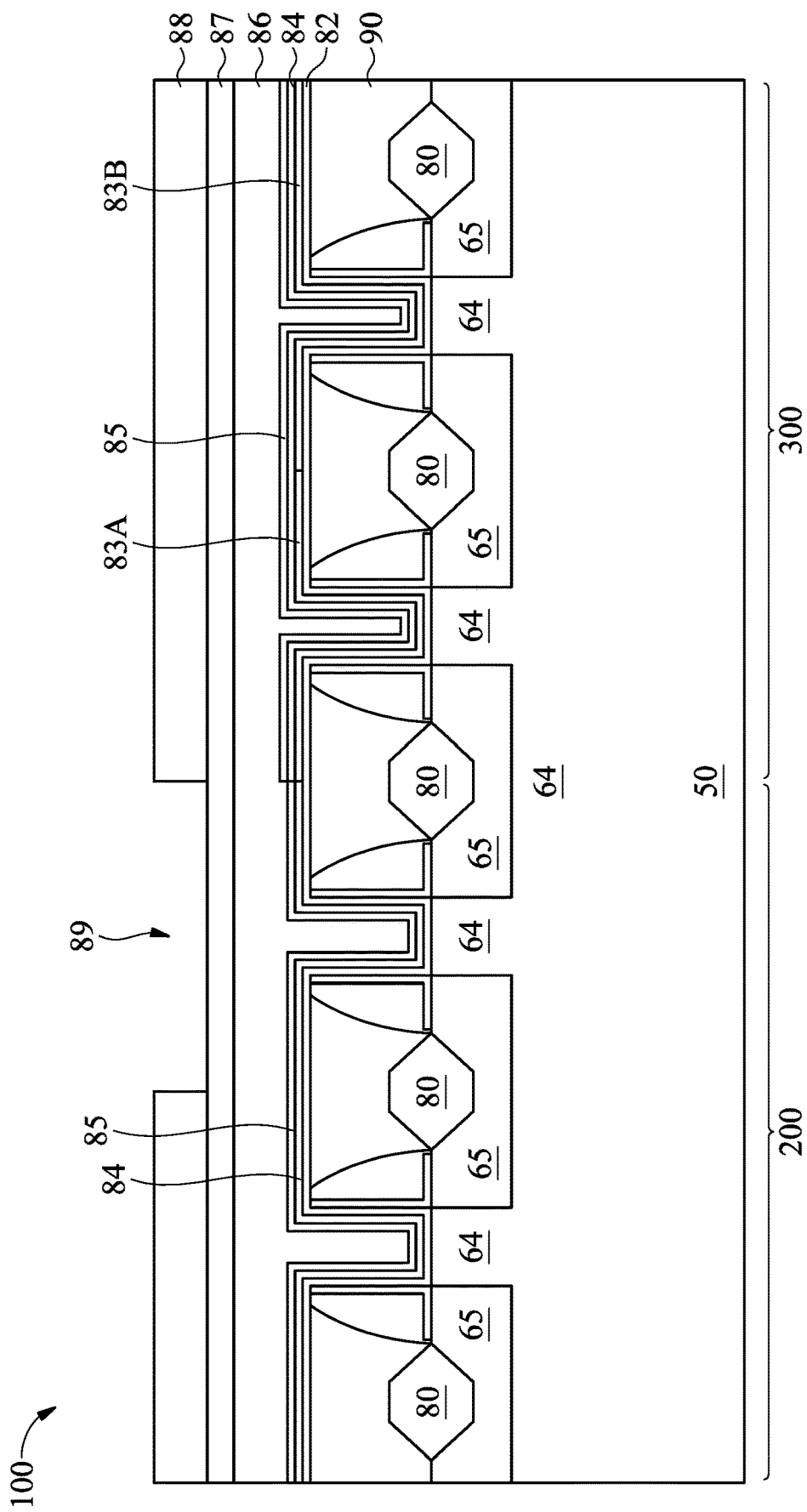

Next, in FIG. 12, a tri-layered photoresist, which includes a bottom anti-reflective coating (BARC) layer 86, a middle layer 87 (e.g., a mask layer), and a top photoresist 88, is formed over the FinFET device 100 of FIG. 11. After being formed over the capping layer 85, the tri-layered photoresist may also fill the recesses 69. The top photoresist 88 of the tri-layered photoresist is next patterned to from an opening 89, which opening 89 is over (e.g., directly over) the recess 69B (see FIG. 11) in the region 200. In an embodiment, the top photoresist 88 is patterned by exposing the top photoresist 88 to a patterned energy source (e.g., light) through, e.g., a reticle. The impact of the energy will cause a chemical reaction in those parts of the photosensitive material that were impacted by the patterned energy source, thereby modifying the physical properties of the exposed portions of the photoresist such that the physical properties of the exposed portions of the top photoresist 88 are different from the physical properties of the unexposed portions of the top photoresist 88. The top photoresist 88 may then be developed with, e.g., a developer, in order to separate the exposed portion of the top photoresist 88 from the unexposed portion of the top photoresist 88.

Figure 13:
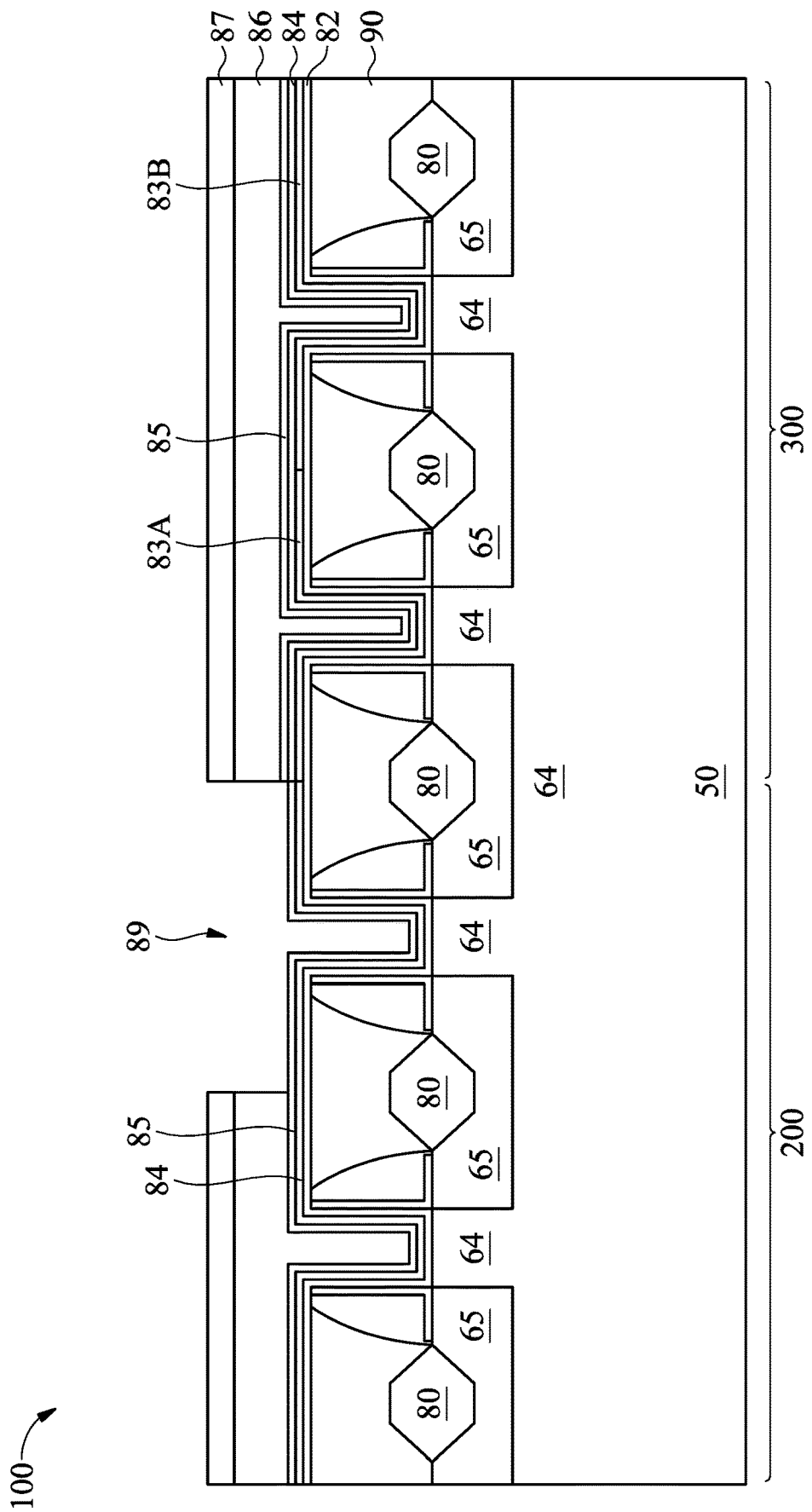

Next, in FIG. 13, the opening 89 in the top photoresist 88 is extended through the middle layer 87 and the BARC layer 86, e.g., using an etching process. The etching process may use the patterned top photoresist 88 as an etching mask. A suitable etching process, such as dry etching, may be used to transfer the pattern of the top photoresist 88 to the middle layer 87 and the BARC layer 86. The etchant used in the etching process may be selective to (e.g., having a higher etching rate for) the materials of the middle layer 87 and the BARC layer 86, such that the portions of the middle layer 87 and the BARC layer 86 underlying the opening 89 are removed without substantially attacking the capping layer 85. After the etching process, portions of the capping layer 85 disposed in the recess 69B (see FIG. 11) and over portions of the upper surface of the first ILD 90 adjacent to the recess 69B are exposed. The top photoresist 88 may be removed by, e.g., an ashing process after the etching process.

Figure 14:
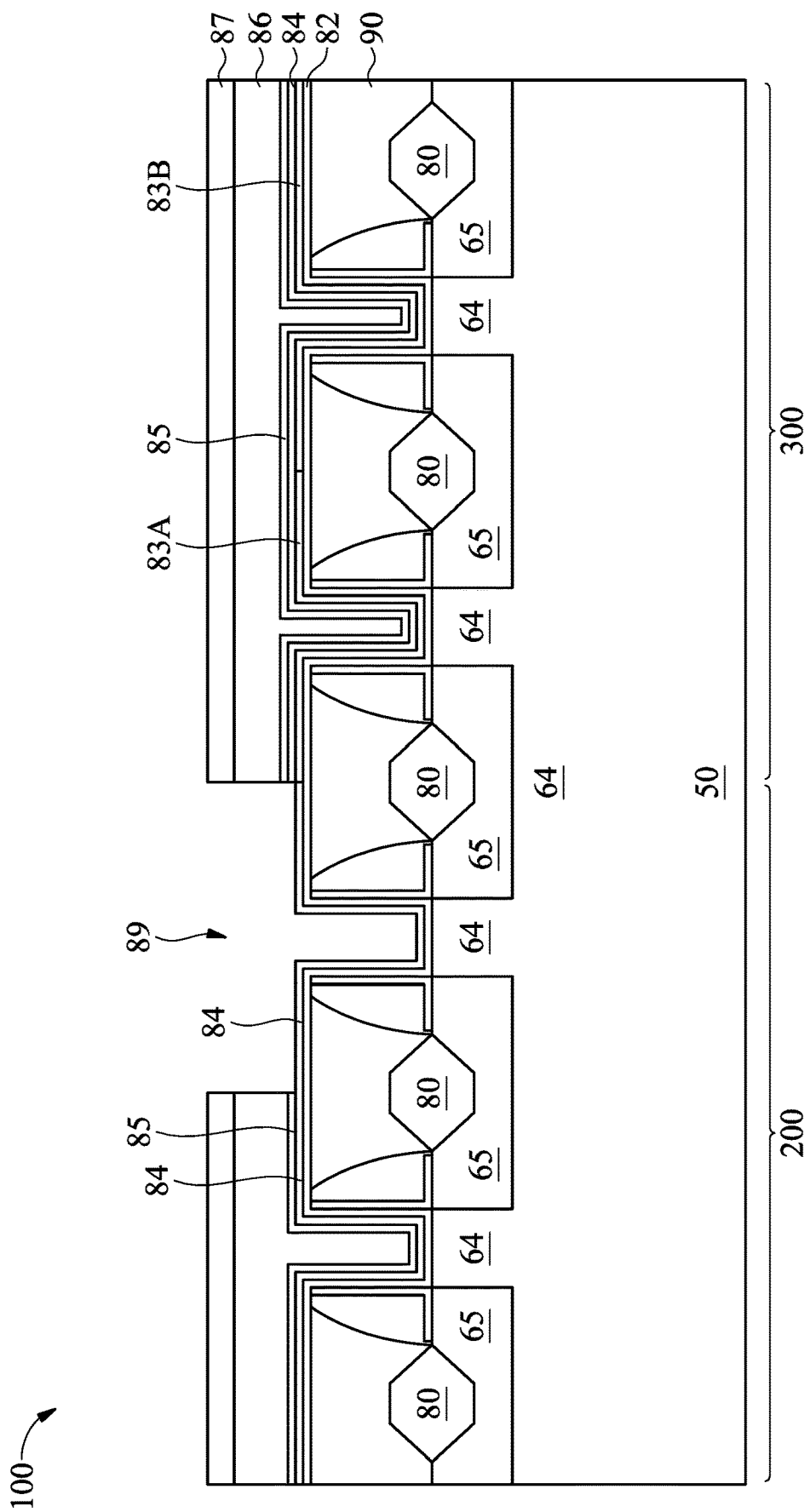

Next, in FIG. 14, a first etching process is performed to selectively remove portions of the capping layer 85 exposed by the opening 89. In some embodiments, the first etching process is a first wet etch process performed using a chemical that is selective to (e.g., having a higher etch rate for) the material of the capping layer 85, such that the capping layer 85 is removed without substantially attacking the underlying N-type work function layer 84. The N-type work function layer 84 is exposed after the first etching process, in some embodiments. In an example embodiment, the capping layer 85 is removed by the first wet etch process using a fluoride-containing chemical. The fluoride-containing chemical is a mixture of hydrofluoric acid (HF) and water (e.g., de-ionized water (DIW)), in some embodiments. A mixing ratio between a volume of HF acid and a volume of DIW of the fluoride-containing chemical is between about 1:100 and about 1: •, as an example.

In some embodiments, the first wet etch process is performed at a temperature between about 20° C. and about 25° C., such as at room temperature, and for a pre-determined duration which may be between, e.g., about 1 minutes and about 3 minutes, depending on the thickness of the capping layer 85. An etching temperature higher than the above disclosed range may cause over-etching of the capping layer 85 (e.g., etching away portions of the N-type work function layer 84) and may result in failure of the control of the selective etching process. An etching temperature lower than the above disclosed range may not remove a target amount (e.g., a target thickness) of capping layer 85 within the pre-determined duration.

Figure 15:
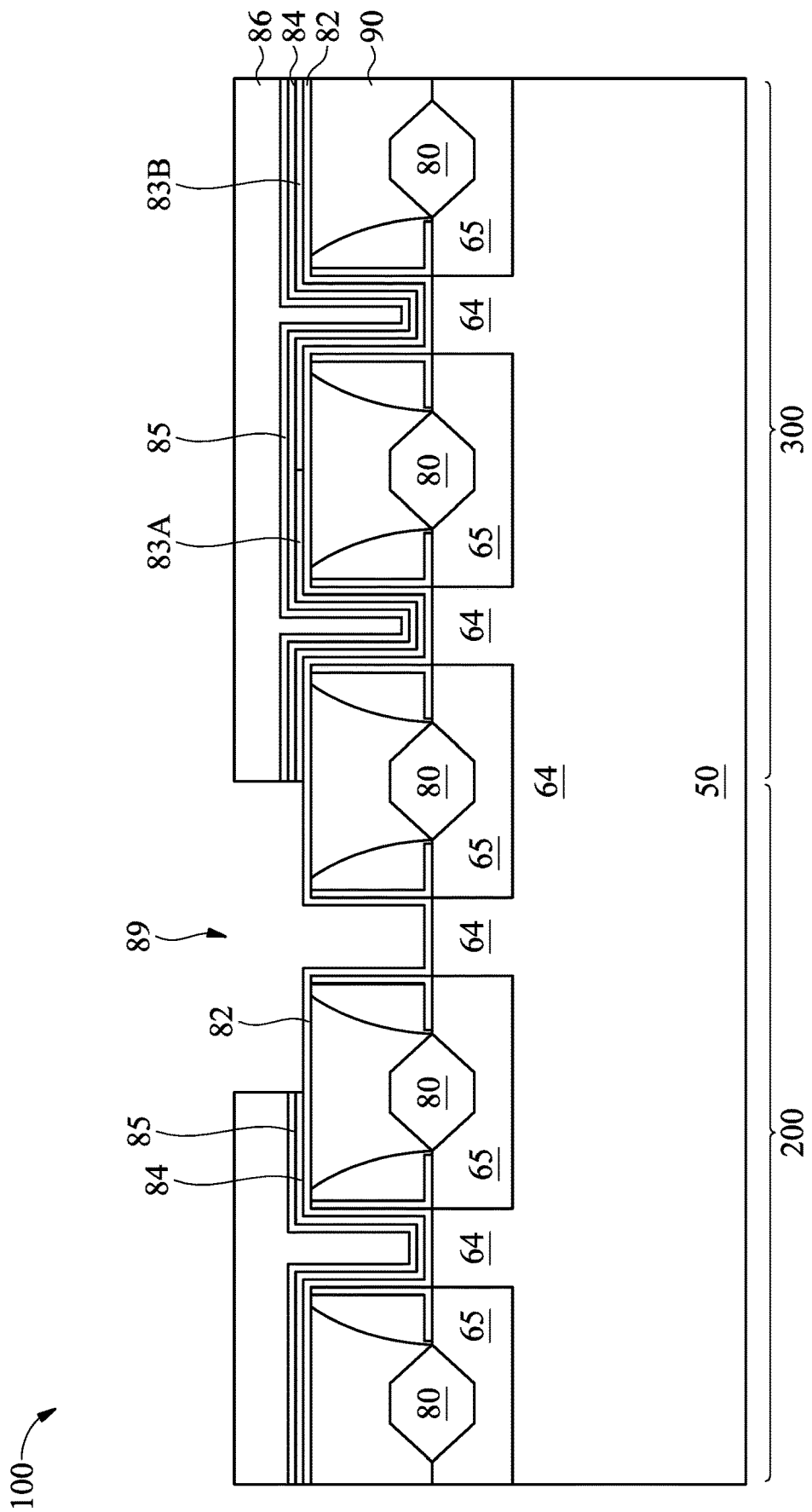

Next, in FIG. 15, a second etching process is performed to selectively remove portions of the N-type work function layer 84 exposed by the opening 89. In some embodiments, the second etching process is a second wet etch process performed using a chemical that is selective to the material of the N-type work function layer 84, such that the N-type work function layer 84 is removed without substantially attacking the underlying gate dielectric layer 82. The gate dielectric layer 82 is exposed after the second etching process, in some embodiments.

In an embodiment, the N-type work function layer 84 is removed by the second wet etch process using a chemical comprising an acid (e.g., hydrogen chloride (HCl)) and an oxidizer (e.g., hydrogen peroxide ($H_2O_2$), or ozone ($O_3$)). For example, the chemical may be a mixture of the acid (e.g., HCl), the oxidizer (e.g., $H_2O_2$, or $O_3$), and DIW. A volume percentage of the acid in the mixture may be between about 1% and about 10%, a volume percentage of the oxidizer in the mixture may be between about 1% and about 10%, and a volume percentage of the DIW in the mixture may be between about 80% and about 98%.

In another embodiment, the N-type work function layer 84 is removed by the second wet etch process using a chemical comprising a base (e.g., ammonia (e.g., $NH_4OH$)) and an oxidizer (e.g., hydrogen peroxide ($H_2O_2$), or ozone ($O_3$)). For example, the chemical may be a mixture of the base (e.g., $NH_4OH$), the oxidizer (e.g., $H_2O_2$, or $O_3$), and DIW. A volume percentage of the base in the mixture may be between about 1% and about 10%, a volume percentage of the oxidizer in the mixture may be between about 1% and about 10%, and a volume percentage of the DIW in the mixture may be between about 80% and about 98%.

In some embodiments, the second wet etch process is performed at a temperature between about 50° C. and about 70° C., and for a pre-determined duration which may be between, e.g., about 3 minutes and about 5 minutes, depending on the thickness of the N-type work function layer 84. An etching temperature higher than the above disclosed range may cause over-etching of the N-type work function layer 84 and may damage the underlying gate dielectric layer 82. An etching temperature lower than the above disclosed range may not remove a target amount (e.g., a target thickness) of the exposed N-type work function layer 84 within the pre-determined duration. The middle layer 87 of the tri-layered photoresist may be removed after the second wet etch process by a suitable method, such as CMP and/or selective etching that is selective to the material of the middle layer 87.

In the example of FIGS. 14 and 15, the capping layer 85 is removed by performing the first wet etch process once, and the N-type work function layer 84 is next removed by performing the second wet etch process once. In other embodiments, the capping layer 85 and the N-type work function layer 84 are removed by performing a plurality of etching cycles, with each etching cycle including the first wet etch process followed by the second wet etch process, where the first wet etch process and the second wet etch process are discussed above with reference to FIGS. 14 and 15, respectively. FIGS. 20-26 illustrate an embodiment where the capping layer 85 and the N-type work function layer 84 are removed by performing, e.g., three etching cycles.

Referring temporarily to FIGS. 20-26, which illustrate cross-sectional views of a portion of the semiconductor device 100 at various stages of the etching cycles, in an embodiment. For simplicity, FIGS. 20-26 only illustrate a portion of the semiconductor device 100 around the gate trench 69B, and not all of the components of the semiconductor device 100 are illustrated. For example, FIGS. 20-26 only illustrate the gate dielectric layer 82, the N-type work function layer 84, and the capping layer 85 during the processing steps corresponding to FIG. 13-15 (e.g., the first etching process and the second etching process). In other words, the processing illustrated by FIGS. 20-26 may replace the processing illustrated in FIGS. 13-15, in an embodiment.

Figure 21:
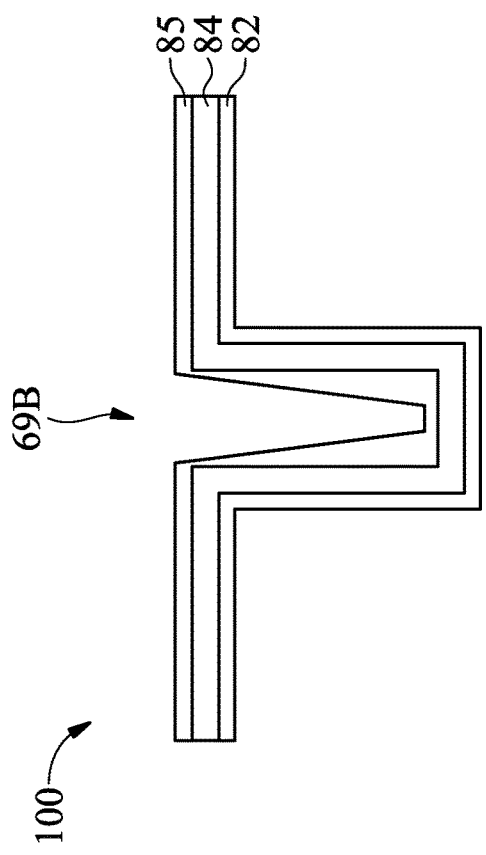
Figure 20:
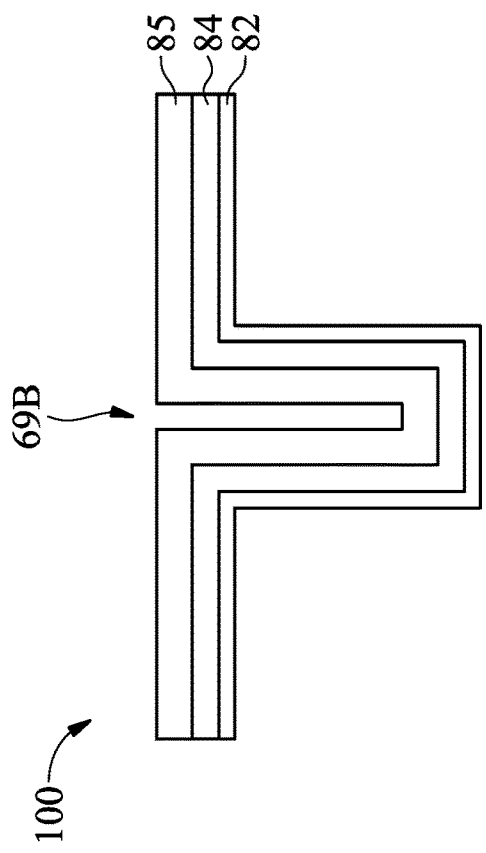

FIG. 20 illustrates a portion of the capping layer 85 exposed by the opening 89 (see FIG. 13) in the photoresist and the layers (e.g., 84, 82) directly under the portion of the capping layer 85. Next, in FIG. 21, the first wet etch process in a first etching cycle is performed to selectively remove the capping layer 85. As illustrated in FIG. 21, the thickness of the capping layer 85 is reduced after the first wet etch process. FIG. 21 also shows a non-uniform thickness for remaining portions of the capping layer 85 disposed along sidewalls of the gate trench 69B. The non-uniform thickness of the capping layer 85 may be caused by the reduced efficiency of the first wet etch process in small gaps (e.g., the gate trench 69B) due to the difficulty of the etching chemicals entering the small gaps. As illustrated in FIG. 21, bottom portions of the capping layer 85 in the gate trench 69B have a larger thickness than upper portions of the capping layer 85. Note that in the example of FIG. 21, portions of the capping layer 85 remain after the first wet etch process of the first etching cycle.

Figures 22, 23:
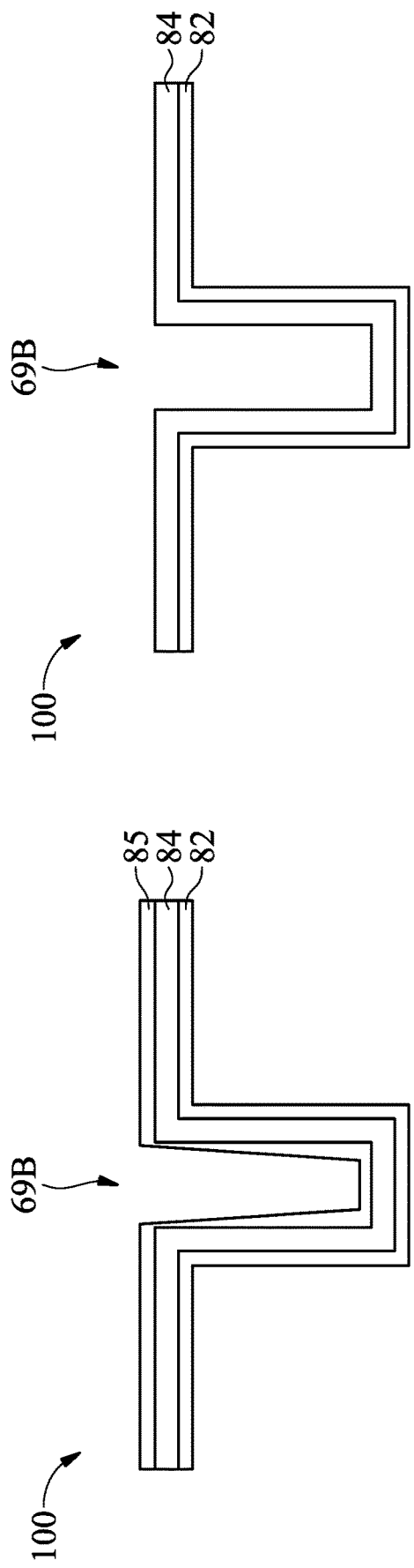

Next, in FIG. 22, the second wet etch process of the first etching cycle is performed. However, since the chemical of the second wet etch process is selective to the material of the N-type work function layer 84, and since remaining portions of the capping layer 85 are disposed over (e.g., cover) the N-type work function layer 84, the second wet etch process remove little, if any, of the remaining portions of the capping layer 85.

Next, in FIG. 23, the first wet etch process of a second etching cycle is performed, which removes the remaining portions of the capping layer 85. Next, in FIG. 24, the second wet etch process of the second etching cycle is performed. As illustrated in FIG. 24, the thickness of the N-type work function layer 84 is reduced, and the remaining portions of the N-type work function layer 84 in the gate trench 69B have a non-uniform thickness.

Next, in FIG. 25, the first wet etch process of a third etching cycle is performed, which removes little, if any, of the remaining portions of the N-type work function layer 84. Next, in FIG. 26, the second wet etch process of the third etching cycle is performed, which removes the remaining portions of the N-type work function layer 84 and exposes the underlying gate dielectric layer 82. Although three etching cycles are used in the illustrated example, any number of etching cycles may be used to remove the capping layer 85 and the N-type work function layer 84.

The first wet etching process and the second wet etching process disclosed herein achieve precise control and excellent etch selectivity for the etch processes. For example, the first wet etch process selectively removes exposed capping layer 85 without substantially attacking the underlying N-type work function layer 84, and the second wet etch process selectively removes exposed N-type work function layer 84 without substantially attacking the underlying gate dielectric layer 82. Compared with a reference method where dry etch processes (e.g., plasma etch processes) are used to remove the capping layer 85 and the N-type work function layer 84, issues related with dry etch processes, such as damage to the gate dielectric layer 82, damage to the sidewall profile of the openings, and damage to the fins 64 and/or loss of the critical dimension (CD) of the fins 64, are avoided or reduced.

Next, referring back to FIG. 16, the BARC layer 86 is removed, e.g., by a suitable removal process such as ashing. After the BARC layer 86 is removed, the remaining portions of the capping layer 85 (e.g., in the regions 200 and 300) are exposed, and portions of the gate dielectric layer 82 in/around the recess 69B are also exposed.

Figure 16:
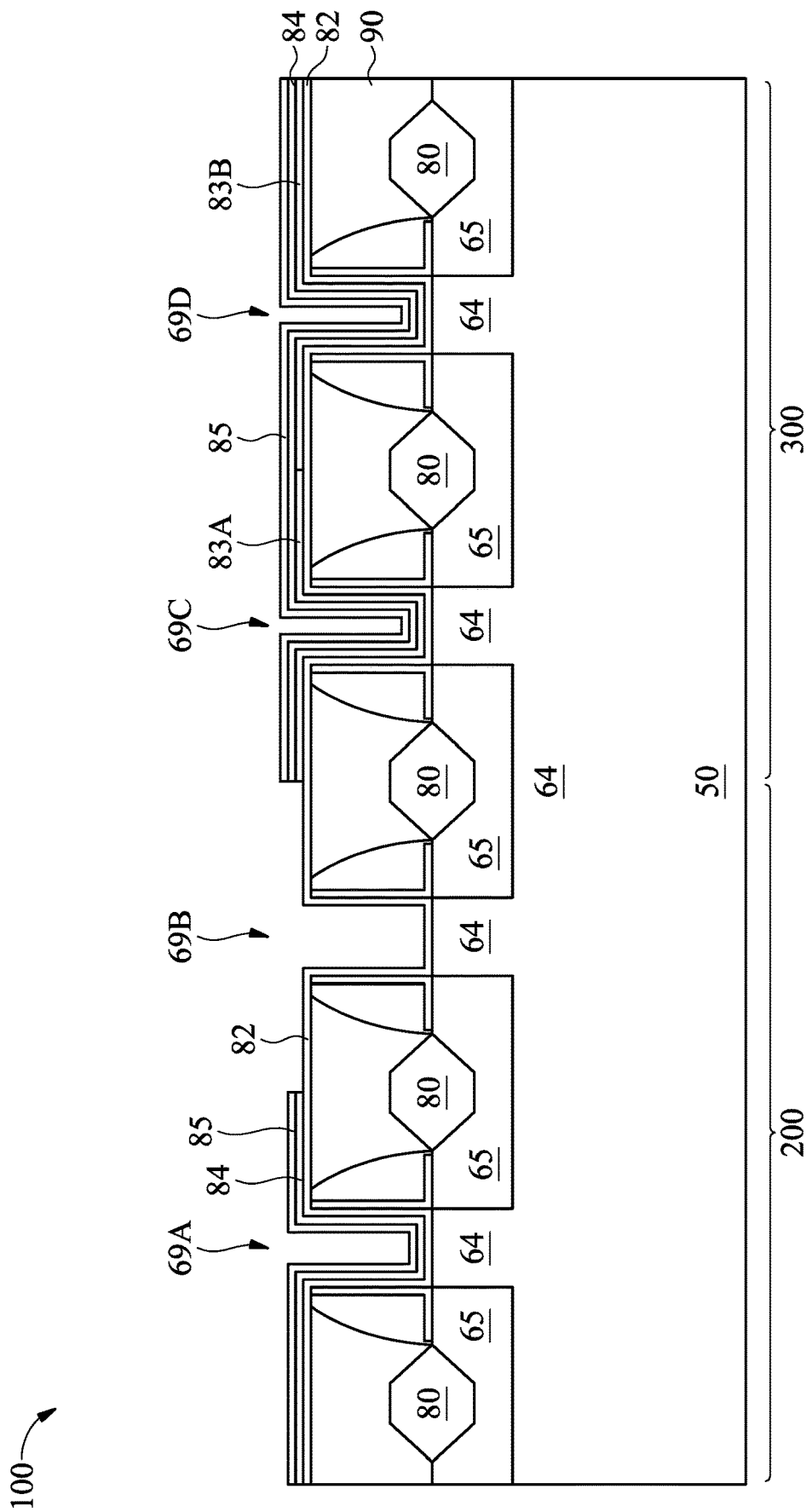
Figure 17:
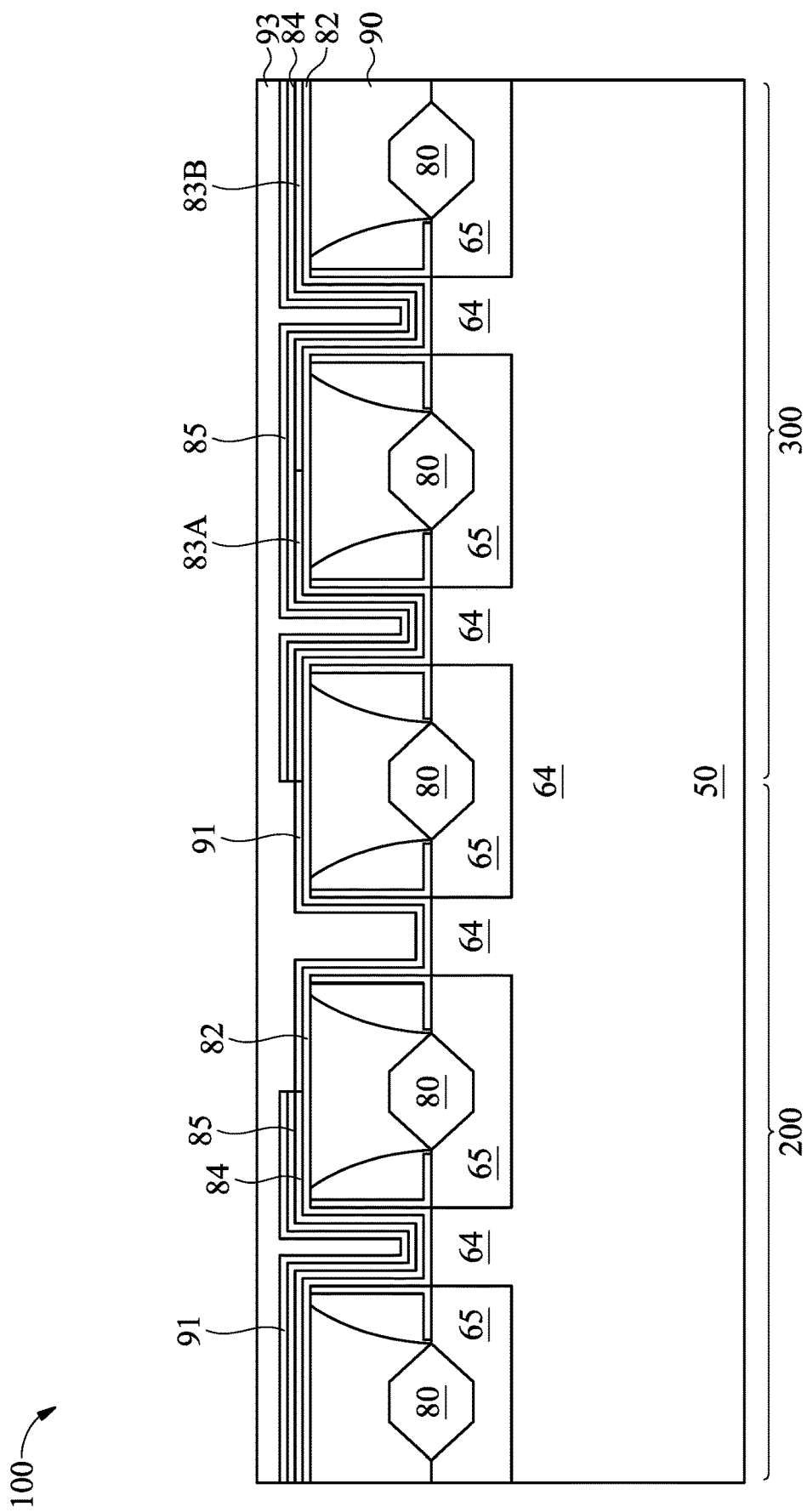

Referring next to FIG. 17, a glue layer 91 is formed, e.g., conformally, over the FinFET device 100 of FIG. 16 in the region 200. A patterned mask layer may be formed to cover the region 300 while the glue layer 91 is formed in the region 200. After the glue layer 91 is formed, the patterned mask layer is removed. As illustrated in FIG. 17, the glue layer 91 is formed over and physically contacts the capping layer 85 in/around the recess 69A (see FIG. 16), and is formed over and physically contacts the gate dielectric layer 82 in/around the recess 69B (see FIG. 16). The glue layer 91 may act as an adhesion layer between the underlying layers (e.g., 85, 82) and a subsequently formed conductive material (e.g., 93), and may be formed of a suitable material such as titanium nitride. The glue layer 91 may also act as a work function layer for the metal gate (see 97B in FIG. 18) to be formed in the recess 69B, in which case the glue layer 91 may comprise a material suitable as an N-type work function material. A suitable formation method, such as CVD, PVD, ALD, combinations thereof, or the like, may be used to form the glue layer 91.

After the glue layer 91 is formed, an electrically conductive material 93 (also referred to as a fill metal) is formed over the glue layer 91 in the region 200 and over (e.g., in physical contact with) the capping layer 85 in the region 300. The electrically conductive material 93 fills the remaining portions of the recesses 69 and forms the gate electrodes of the metal gates (see 97A, 97B, 97C and 97D in FIG. 18). In an embodiment, the electrically conductive material 93 is tungsten, although other suitable electrically conductive material, such as cobalt, gold, copper, aluminum, combinations thereof, or the like, may also be used. A suitable formation method, such as CVD, PVD, ALD, or the like, may be used to form the electrically conductive material 93.

Figure 18:
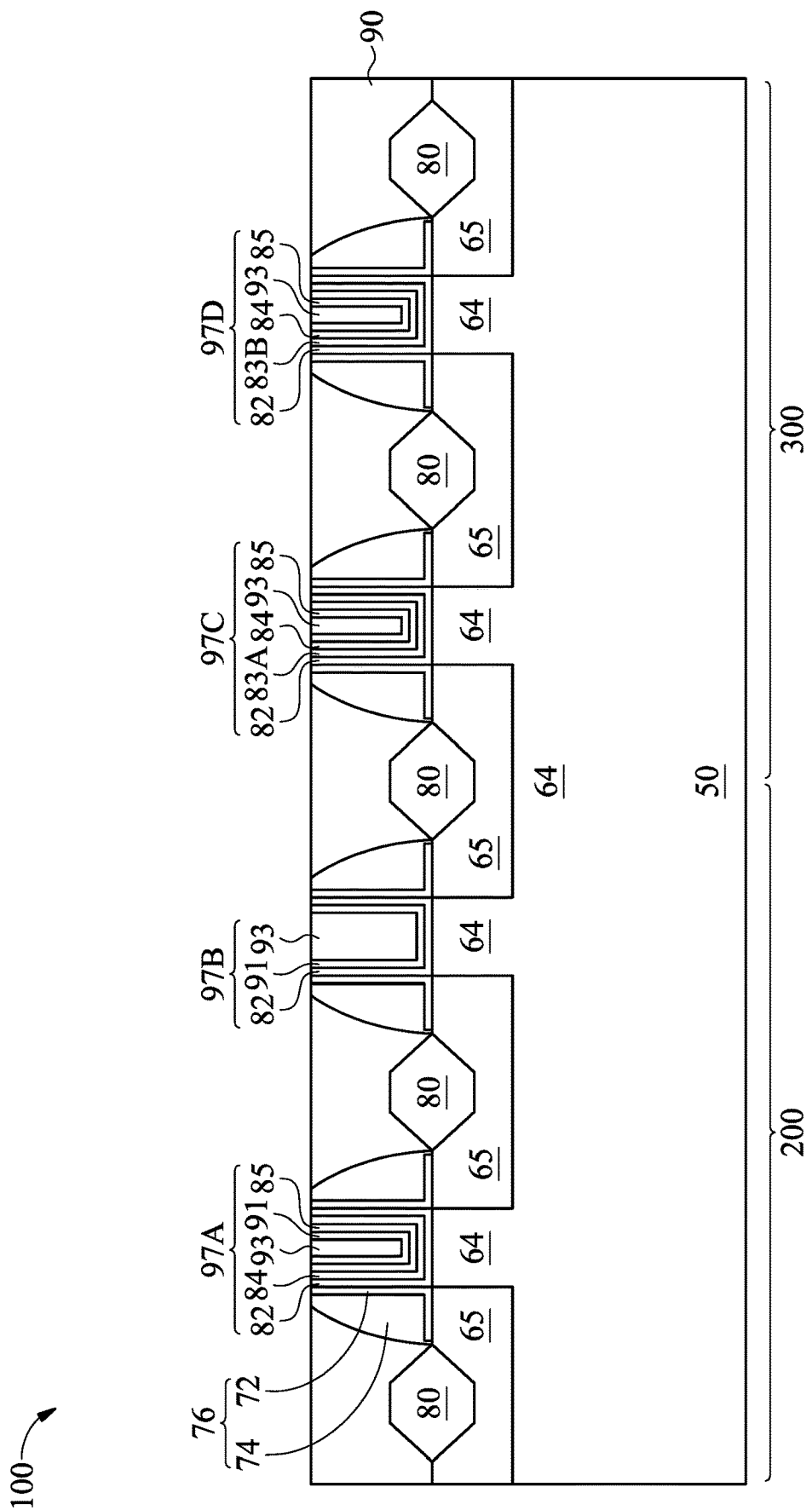

Referring next to FIG. 18, a planarization process, such as CMP, may be performed to remove excess portions of the different layers (e.g., 82, 83A, 83B, 84, 85, 91, and 93) disposed over the upper surface of the first ILD 90. After the planarization process, metal gates 97 (e.g., 97A, 97B, 97C, and 97D) are formed. A thermal driving-in process may be performed next at a temperature between about 300° C. and about 500° C. to drive the materials of the work function layers into the gate dielectric layer 82 of the metal gates 97.

In the embodiment of FIG. 18, each of the metal gates 97 has a different structure. For example, the metal gate 97A includes the gate dielectric layer 82 disposed along sidewalls of respective gate spacers 76 and along sidewalls and a top surface of the fin 64. The N-type work function layer 84, the capping layer 85, the glue layer 91, and the fill metal 93 are formed successively over the gate dielectric layer 82 of the metal gate 97A. The metal gate 97B includes the gate dielectric layer 82 disposed along sidewalls of respective gate spacers 76 and along the sidewalls and the top surface of the fin 64. The glue layer 91 and the fill metal 93 are formed successively over the gate dielectric layer 82 of the metal gate 97B. The metal gate 97C includes the gate dielectric layer 82 disposed along sidewalls of respective gate spacers 76 and along the sidewalls and the top surface of the fin 64. The first P-type work function layer 83A, the N-type work function layer 84, the capping layer 85, and the fill metal 93 are formed successively over the gate dielectric layer 82 of the metal gate 97C. The metal gate 97D includes the gate dielectric layer 82 disposed along sidewalls of respective gate spacers 76 and along the sidewalls and the top surface of the fin 64. The second P-type work function layer 83B, the N-type work function layer 84, the capping layer 85, and the fill metal 93 are formed successively over the gate dielectric layer 82 of the metal gate 97D.

In the example of FIG. 18, each of the metal gates 97 has a different gate structure with different work function layer(s). This allows for great flexibility in tuning the threshold voltages of the metal gates 97, thus improving the performance, functionality, and the application of the FinFET device 100 formed.

Figure 19:
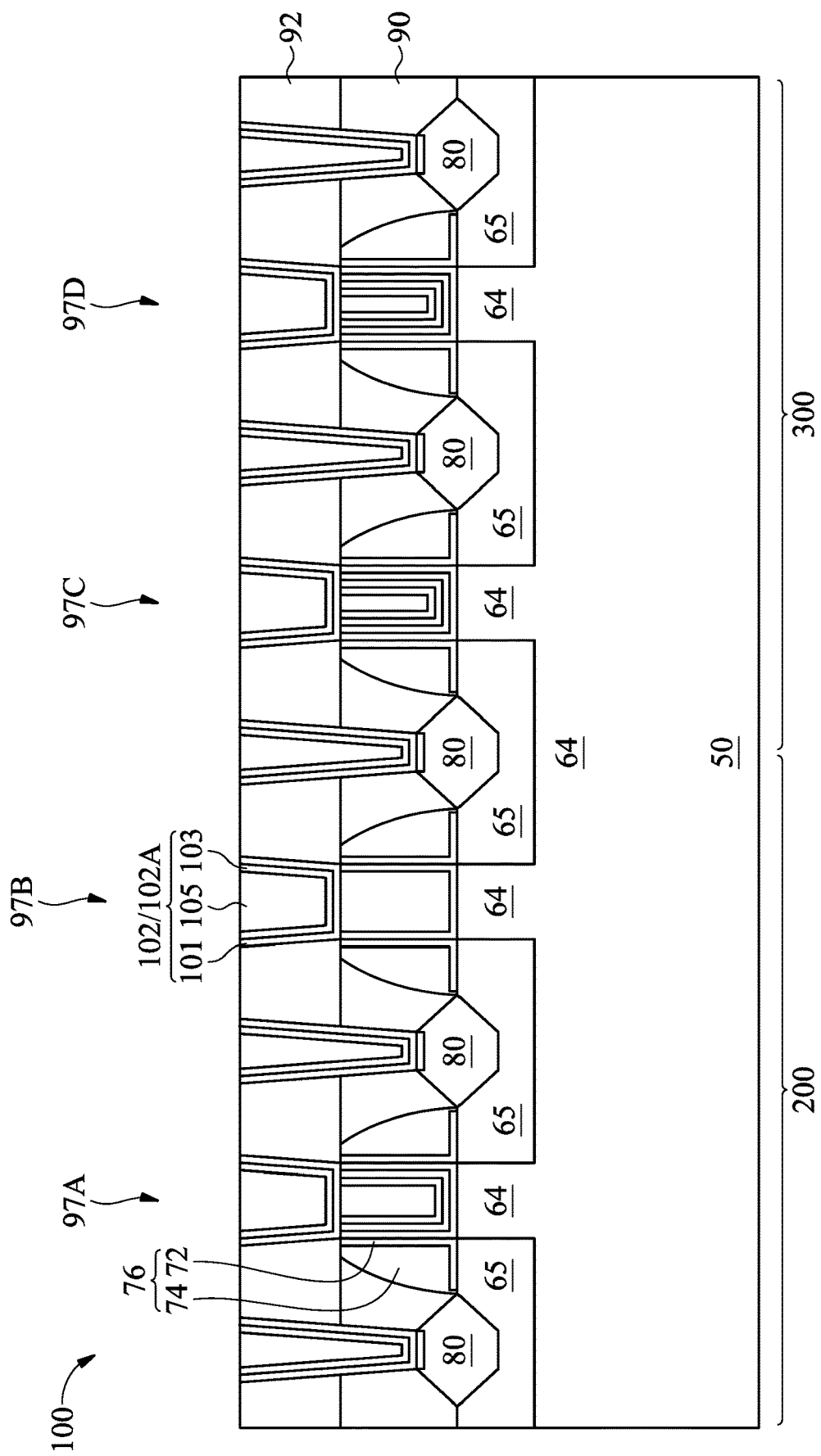

Referring next to FIG. 19, a second ILD 92 is formed over the first ILD 90. Contact openings are formed through the second ILD 92 to expose the metal gates 97 (e.g., 97A, 97B, 97C, and 97D). Contact openings are also formed through the first ILD 90 and the second ILD 92 to expose the source/drain regions 80.

In an embodiment, the second ILD 92 is a flowable film formed by a flowable CVD method. In some embodiments, the second ILD 92 is formed of a dielectric material such as PSG, BSG, BPSG, USG, or the like, and may be deposited by any suitable method, such as CVD and PECVD. The contact openings may be formed using photolithography and etching.

After the contact openings are formed, silicide regions 95 are formed over the source/drain regions 80. In some embodiments, the silicide regions 95 are formed by first depositing a metal capable of reacting with semiconductor materials (e.g., silicon, germanium) to form silicide or germanide regions, such as nickel, cobalt, titanium, tantalum, platinum, tungsten, other noble metals, other refractory metals, rare earth metals or their alloys, over the exposed portions of the source/drain regions 80, then performing a thermal anneal process to form the silicide regions 95. The un-reacted portions of the deposited metal are then removed, e.g., by an etching process. Although regions 95 are referred to as silicide regions, regions 95 may also be germanide regions, or silicon germanide regions (e.g., regions comprising silicide and germanide).

Next, contacts 102 (e.g., 102A or 102B, also referred to as contact plugs) are formed in the contact openings. Each of the contacts 102 includes a barrier layer 101, a seed layer 103, and an electrically conductive material 105, and is electrically coupled to the underlying conductive feature (e.g., metal gate 97, or silicide region 95), in the illustrated embodiment. The contacts 102A that are electrically coupled to the metal gates 97 may be referred to as gate contacts, and the contacts 102B that are electrically coupled to the silicide regions 95 may be referred to as source/drain contacts.

In some embodiments, the barrier layer 101 is formed conformally along sidewalls and bottoms of the contact openings. The barrier layer 101 may comprise an electrically conductive material such as titanium nitride, although other materials, such as tantalum nitride, titanium, tantalum, or the like, may alternatively be utilized. The barrier layer 101 may be formed using a CVD process, such as PECVD. However, other alternative processes, such as sputtering, metal organic chemical vapor deposition (MOCVD), or ALD, may alternatively be used.

Next, the seed layer 103 is formed conformally over the barrier layer 101. The seed layer 103 may include copper, titanium, tantalum, titanium nitride, tantalum nitride, the like, or a combination thereof, and may be deposited by ALD, sputtering, PVD, or the like. In some embodiments, the seed layer is a metal layer, which may be a single layer or a composite layer comprising a plurality of sub-layers formed of different materials. For example, the seed layer 103 may comprise a titanium layer and a copper layer over the titanium layer.

Next, the electrically conductive material 105 is deposited over the seed layer 103, and fills the remaining portions of the contact openings. The electrically conductive material 105 may be made of a metal-containing material such as gold, aluminum, tungsten, the like, combinations thereof, or multi-layers thereof, and may be formed by, e.g., electroplating, electroless plating, or other suitable method. After the formation of the electrically conductive material 105, a planarization process, such as a CMP, may be performed to remove the excess portions of the barrier layer 101, the seed layer 103, and the electrically conductive material 105, which excess portions are over the top surface of the second ILD 92. The resulting remaining portions of the barrier layer 101, the seed layer 103, and the electrically conductive material 105 thus form the contacts 102 of the resulting FinFET device 100.

The gate trenches 69 of the FinFET device 100 are illustrated to have U-shaped cross-sections as an example. The gate trenches 69 may have other shapes of cross-sections. FIGS. 27-29 illustrate cross-sectional views of a portion of a semiconductor device 100A with Y-shaped gate trenches (e.g., 69B) at various stages of fabrication, in an embodiment. The semiconductor device 100A is similar to the FinFET device 100, but with Y-shaped cross-sections for the gate trenches 69. For simplicity, FIGS. 27-29 only illustrate a portion of the semiconductor device 100A around the gate trench 69B, and not all of the components of the semiconductor device 100A are illustrated. For example, FIGS. 27-29 only illustrate the gate dielectric layer 82, the N-type work function layer 84, and the capping layer 85 during the processing steps corresponding to FIG. 13-15 (e.g., the first etching process and the second etching process). In other words, the processing illustrated by FIGS. 27-29 correspond to those illustrated by FIGS. 13-15, respectively. One of ordinary skill will readily appreciate that by replacing the gate trenches 69 of the FinFET device 100 with the Y-shaped gate trenches, the processing steps illustrated by FIGS. 2-19 illustrate the sequential processing steps to form the semiconductor device 100A, which semiconductor device 100A has metal gates 97 with Y-shaped cross-sections.

The Y-shaped gate trenches may be formed by, e.g., forming gate spacer 76 having non-straight sidewalls that correspond to the shape of the exterior sidewalls of the gate dielectric layer 82 illustrated in FIG. 27. The gate spacers 76 with the non-straight sidewalls may be formed by, e.g., forming dummy gate structures 75 that have non-straight sidewalls and forming gate spacers along the sidewalls of the dummy gate structures 75. As illustrated in FIGS. 28 and 29 respectively, the capping layer 85 is selectively removed by the first etching process (e.g., the first wet etch process), and the N-type work function layer 84 is selectively removed by the second etching process (e.g., the second wet etch process), where the first etching process and the second etching process are discussed above with reference to FIGS. 14 and 15, respectively.

Without the presently disclosed method, it may be extremely difficult to remove the capping layer 85 and the N-type work function layer 84 precisely for the Y-shaped gate trenches, due to the narrow lower portion of the gate trenches. The presently disclosed method, however, achieves selective removal of the capping layer 85 and the N-type work function layer 84 with precision and ease. Damage to the gate dielectric layer 82 is avoided or reduced, and a substantially uniform thickness of the gate dielectric layer 82 is achieved.

Figure 30:
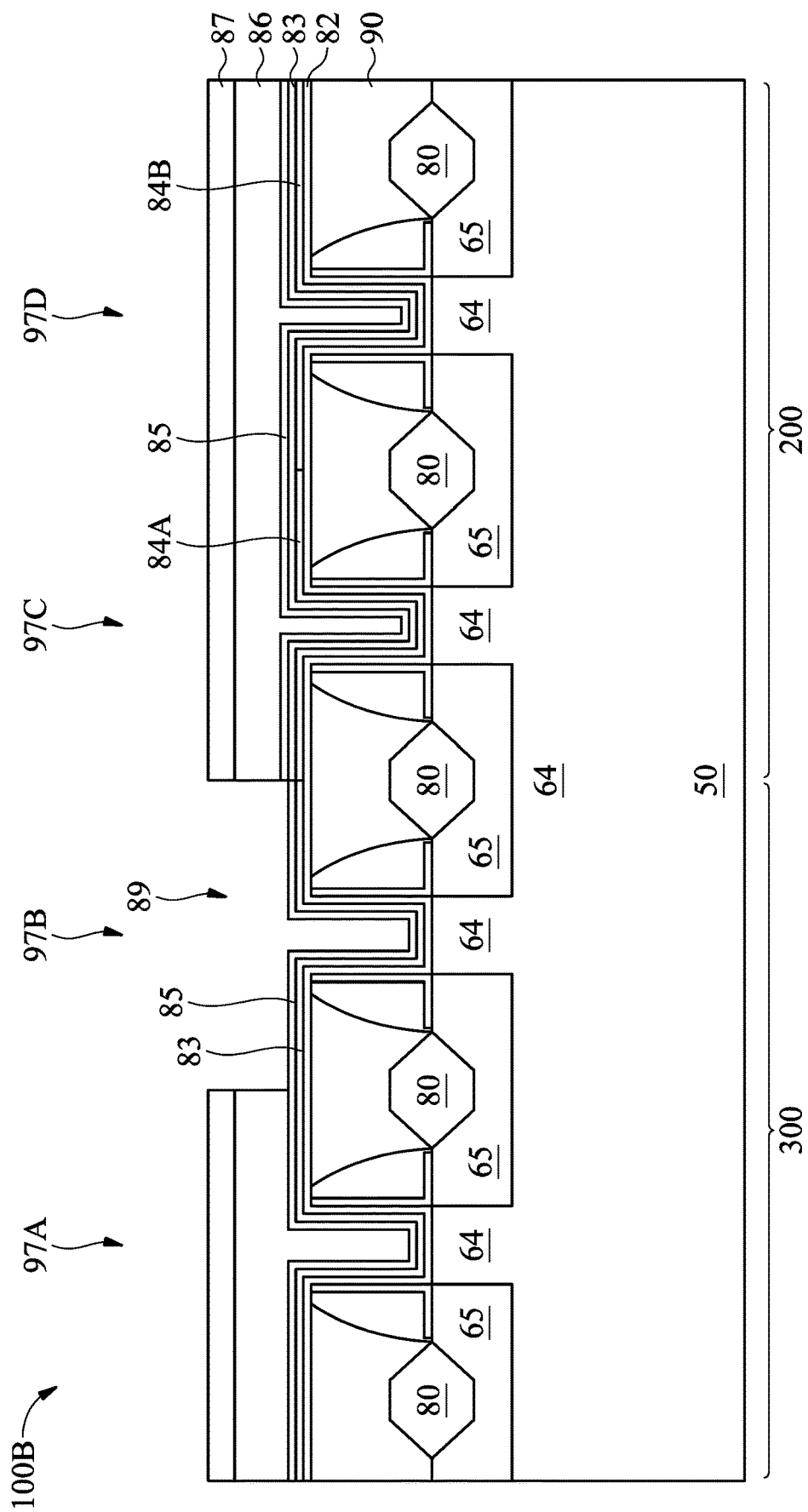
FIG. 30 illustrates a cross-sectional view of a semiconductor device, in an embodiment.

FIG. 30 illustrates a cross-sectional view of a semiconductor device 100B at a stage of fabrication, in an embodiment. The semiconductor device 100B in FIG. 30 is similar to the semiconductor device 100 in FIG. 13, but with a few modifications. For example, the two metal gates 97A/97B on the left side of FIG. 30 are in a P-type device region 300, and the two metal gates 97C/97D on the right side of FIG. 30 are in an N-type device region 200. Accordingly, a first N-type work function layer 84A and a second N-type work function layer 84B are formed over the gate dielectric layer 82 in the gate trenches of the metal gates 97C and 97D, respectively. FIG. 30 also illustrates the P-type work function layer 83 and the capping layer 85 disposed in both the N-type device region 200 and the P-type device region 300. FIG. 30 further illustrates the patterned photoresist (e.g., 86 and 87) with the opening 89.

In some embodiments, a two-step etching process similar to those illustrated in FIGS. 14 and 15 is performed to remove the capping layer 85 and the P-type work function layer 83 under the opening 89. For example, a first etching process using a first chemical selective to the material of the capping layer 85 is performed to selectively remove the capping layer 85. Next, a second etching process using a chemical selective to the material of the P-type work function layer 83 is performed to selectively remove the P-type work function layer 83 and to expose the gate dielectric layer 82. In other embodiments, a plurality of etching cycles are performed to remove the capping layer 85 and the P-type work function layer 83, where each etching cycle includes a first etching process followed by a second etching process. After the gate dielectric layer 82 of the metal gate 97B is exposed, processing steps similar to those illustrated in FIGS. 16-19 may be performed to form the semiconductor device 100B.

Variations to the disclose embodiments are possible and are fully intended to be included within the scope of the disclosure. For example, the number of fins and/or the number of gate structures in the FinFET device may be changed from the illustrated examples without departing from the spirit of the disclosure. As another example, although the gate trenches 69 (e.g., 69A, 69B, 69C, and 69d) are illustrated as being disposed over a same fin along a same cross-section, each of the gate trenches 69 may be disposed over a different fin and along a different cross-section, depending on the design of the FinFET device.

Figure 31:
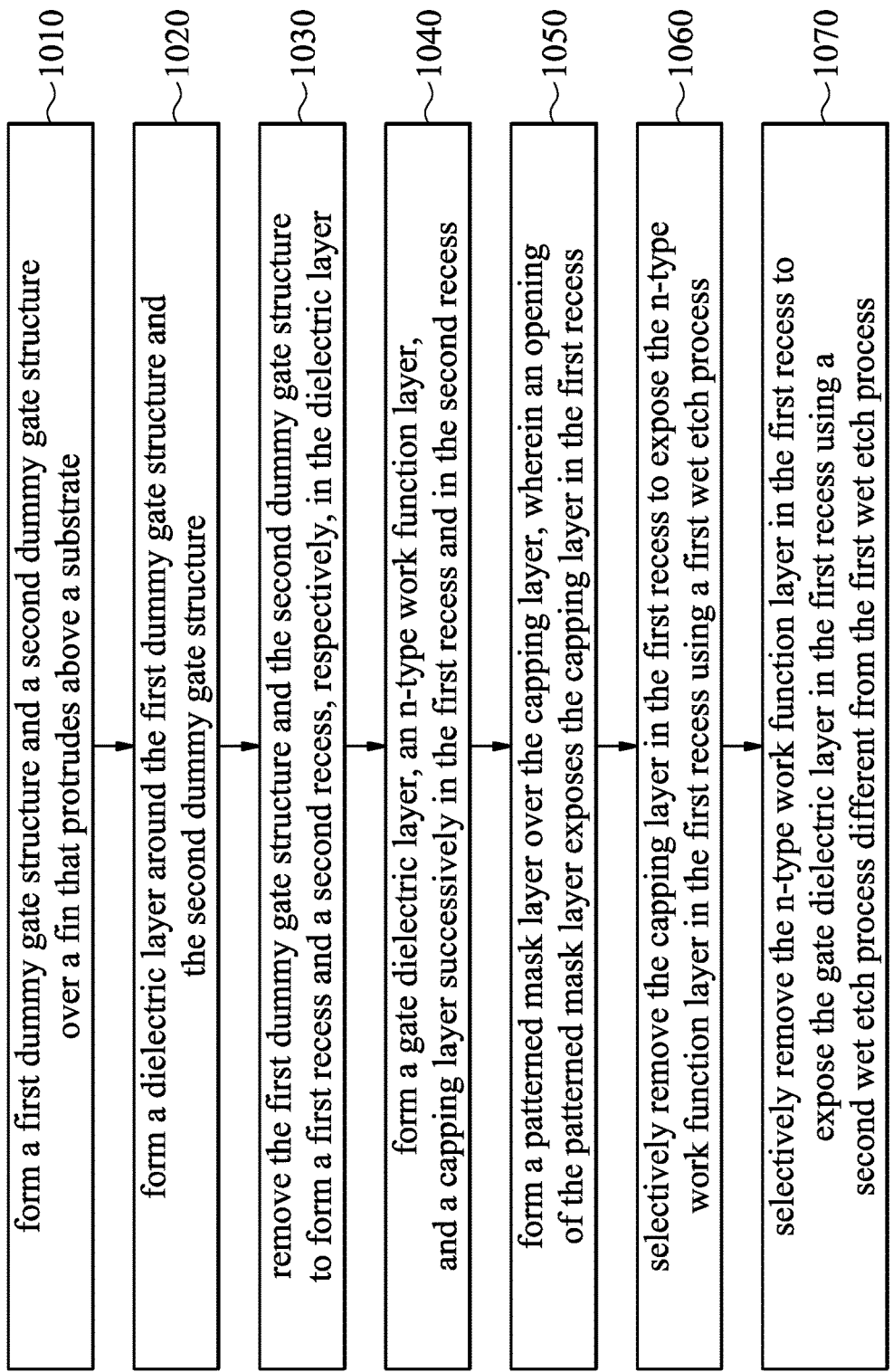
FIG. 31 illustrates a flow chart of method of making a semiconductor device, in accordance with some embodiments.

FIG. 31 illustrates a flow chart of a method of fabricating a semiconductor structure, in accordance with some embodiments. It should be understood that the embodiment method shown in FIG. 31 is merely an example of many possible embodiment methods. One of ordinary skill in the art would recognize many variations, alternatives, and modifications. For example, various steps as illustrated in FIG. 31 may be added, removed, replaced, rearranged and repeated.

Referring to FIG. 31, at step 1010, a first dummy gate structure and a second dummy gate structure are formed over a fin that protrudes above a substrate. At step 1020, a dielectric layer is formed around the first dummy gate structure and the second dummy gate structure. At step 1030, the first dummy gate structure and the second dummy gate structure are removed to form a first recess and a second recess, respectively, in the dielectric layer. At step 1040, a gate dielectric layer, an N-type work function layer, and a capping layer are formed successively in the first recess and in the second recess. At step 1050, a patterned mask layer is formed over the capping layer, wherein an opening of the patterned mask layer exposes the capping layer in the first recess. At step 1060, the capping layer in the first recess is selectively removed to expose the N-type work function layer in the first recess using a first wet etch process. At step 1070, the N-type work function layer in the first recess is selectively removed to expose the gate dielectric layer in the first recess using a second wet etch process different from the first wet etch process.

Embodiments may achieve advantages. The first wet etching process and the second wet etching process disclosed herein achieve precise control and excellent etch selectivity for the etch processes. For example, the first wet etch process selectively removes exposed capping layer 85 without attacking the underlying N-type work function layer 84, and the second wet etch process selectively removes exposed N-type work function layer 84 without attacking the underlying gate dielectric layer 82. By using the disclosed methods, issues such as damage to the gate dielectric layer 82, damage to the sidewall profile of the openings, and damage to the fins 64 and/or loss of the critical dimension (CD) of the fins 64, are avoided or reduced. In addition, the disclosed methods allows for increased flexibility in the structure of the metal gates, such as allowing for choosing and tuning different work function layers (thus different threshold voltages) in different metal gates, which improving the performance, functionality, and the application of the semiconductor device formed.

In an embodiment, a method of forming a semiconductor device includes forming a first dummy gate structure and a second dummy gate structure over a fin that protrudes above a substrate; forming a dielectric layer around the first dummy gate structure and the second dummy gate structure; removing the first dummy gate structure and the second dummy gate structure to form a first recess and a second recess, respectively, in the dielectric layer; forming a gate dielectric layer, an N-type work function layer, and a capping layer successively in the first recess and in the second recess; forming a patterned mask layer over the capping layer, wherein an opening of the patterned mask layer exposes the capping layer in the first recess; selectively removing the capping layer in the first recess to expose the N-type work function layer in the first recess using a first wet etch process; and selectively removing the N-type work function layer in the first recess to expose the gate dielectric layer in the first recess using a second wet etch process different from the first wet etch process. In an embodiment, the gate dielectric layer is formed of a high-K dielectric material, the N-type work function layer is formed of titanium aluminum carbon, and the capping layer is formed using titanium nitride, silicon, silicon oxide, silicon oxynitride, or a combination thereof. In an embodiment, the first wet etch process is performed using a fluoride-containing chemical. In an embodiment, the fluoride-containing chemical is a mixture of hydrofluoric acid and water. In an embodiment, the second wet etch process is performed using a chemical comprising an acid and an oxidizer. In an embodiment, the acid is hydrogen chloride, and the oxidizer is ozone or hydrogen peroxide. In an embodiment, the second wet etch process is performed using a chemical comprising a base and an oxidizer. In an embodiment, the base is ammonia hydroxide, and the oxidizer is ozone or hydrogen peroxide. In an embodiment, the method further includes: removing the patterned mask layer after the second wet etch process to expose the capping layer in the second recess; forming a glue layer in the first recess and in the second recess, wherein the glue layer in the first recess extends along and physically contacts the gate dielectric layer, and the glue layer in the second recess extends along and physically contacts the capping layer; and filling the first recess and the second recess with an electrically conductive material after forming the glue layer. In an embodiment, the capping layer is formed of titanium nitride. In an embodiment, the method further includes: forming a third dummy gate structure and a fourth dummy gate structure over the fin, wherein the dielectric layer surrounds the third dummy gate structure and the fourth dummy gate structure; removing the third dummy gate structure and the fourth dummy gate structure to form a third recess and a fourth recess, respectively, in the dielectric layer; forming the gate dielectric layer, a first P-type work function layer, and the capping layer successively in the third recess; forming the gate dielectric layer, a second P-type work function layer, and the capping layer successively in the fourth recess; and after removing the patterned mask layer, filling the third recess and the fourth recess with the electrically conductive material. In an embodiment, the electrically conductive material in the third recess and the fourth recess physically contacts the capping layer.

In an embodiment, a method of forming a semiconductor device includes: forming a first dummy gate structure and a second dummy gate structure over a fin protruding above a substrate, wherein the first dummy gate structure and the second dummy gate structure are surrounded by a dielectric layer; and replacing the first dummy gate structure and the second dummy gate structure with a first metal gate and a second metal gate, respectively, wherein the replacing comprises: removing the first dummy gate structure and the second dummy gate structure to form a first recess and a second recess in the dielectric layer, respectively; forming a gate dielectric layer in the first recess and in the second recess; forming an N-type work function layer and a capping layer successively over the gate dielectric layer in the second recess but not in the first recess; and filling the first recess and the second recess with an electrically conductive material. In an embodiment, forming the N-type work function layer and the capping layer comprises: forming, in the first recess and the second recess, the N-type work function layer and the capping layer successively over the gate dielectric layer; forming a patterned mask layer over the capping layer, wherein the patterned mask layer has an opening that exposes the capping layer in the first recess; selectively removing the capping layer in the first recess using a first wet etch process; and after the first wet etch process, selectively removing the N-type work function layer in the first recess using a second wet etch process different from the first wet etch process. In an embodiment, the first wet etch process is performed using a fluoride-containing chemical. In an embodiment, the second wet etch process is performed using a mixture of an acid and an oxidizer, or using a mixture of a base and an oxidizer. In an embodiment, the method further includes, before filling the first recess and the second recess, forming a glue layer in the first recess on the gate dielectric layer and in the second recess on the capping layer.

In an embodiment, a semiconductor device includes: a fin over a substrate; a first metal gate over the fin, wherein the first metal gate comprises a gate dielectric layer over the fin, a glue layer over and contacting the gate dielectric layer, and a fill metal over and contacting the glue layer; and a second metal gate over the fin and adjacent to the first metal gate, wherein the second metal gate comprises the gate dielectric layer over the fin, an N-type work function layer over and contacting the gate dielectric layer, a capping layer over and contacting the N-type work function layer, the glue layer over and contacting the capping layer, and the fill metal over and contacting the glue layer. In an embodiment, the first metal gate and the second metal gate are in an N-type device region of the fin. In an embodiment, the semiconductor device further includes: a source/drain region between the first metal gate and the second metal gate; a first dielectric layer over the substrate, wherein the first dielectric layer surrounds the first metal gate and the second metal gate; and a contact plug extending into the first dielectric layer and electrically coupled to the source/drain region.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method of forming a semiconductor device, the method comprising:
    forming a first dummy gate structure and a second dummy gate structure over a fin that protrudes above a substrate;
    forming a dielectric layer around the first dummy gate structure and the second dummy gate structure;
    removing the first dummy gate structure and the second dummy gate structure to form a first recess and a second recess, respectively, in the dielectric layer;
    forming a gate dielectric layer, an N-type work function layer, and a capping layer successively in the first recess and in the second recess;
    forming a patterned mask layer over the capping layer, wherein an opening of the patterned mask layer exposes the capping layer in the first recess;
    selectively removing the capping layer in the first recess to expose the N-type work function layer in the first recess using a first wet etch process; and
    selectively removing the N-type work function layer in the first recess to expose the gate dielectric layer in the first recess using a second wet etch process different from the first wet etch process.

2. The method of claim 1, wherein the gate dielectric layer is formed of a high-K dielectric material, the N-type work function layer is formed of titanium aluminum carbon, and the capping layer is formed using titanium nitride, silicon, silicon oxide, silicon oxynitride, or a combination thereof.

3. The method of claim 1, wherein the first wet etch process is performed using a fluoride-containing chemical.

4. The method of claim 3, wherein the fluoride-containing chemical is a mixture of hydrofluoric acid and water.

5. The method of claim 3, wherein the second wet etch process is performed using a chemical comprising an acid and an oxidizer.

6. The method of claim 5, wherein the acid is hydrogen chloride, and the oxidizer is ozone or hydrogen peroxide.

7. The method of claim 3, wherein the second wet etch process is performed using a chemical comprising a base and an oxidizer.

8. The method of claim 7, wherein the base is ammonia hydroxide, and the oxidizer is ozone or hydrogen peroxide.

9. The method of claim 1, further comprising:
  removing the patterned mask layer after the second wet etch process to expose the capping layer in the second recess;
  forming a glue layer in the first recess and in the second recess, wherein the glue layer in the first recess extends along and physically contacts the gate dielectric layer, and the glue layer in the second recess extends along and physically contacts the capping layer; and
  filling the first recess and the second recess with an electrically conductive material after forming the glue layer.

10. The method of claim 9, wherein the capping layer is formed of titanium nitride.

11. The method of claim 9, further comprising:
  forming a third dummy gate structure and a fourth dummy gate structure over the fin, wherein the dielectric layer surrounds the third dummy gate structure and the fourth dummy gate structure;
  removing the third dummy gate structure and the fourth dummy gate structure to form a third recess and a fourth recess, respectively, in the dielectric layer;
  forming the gate dielectric layer, a first P-type work function layer, and the capping layer successively in the third recess;
  forming the gate dielectric layer, a second P-type work function layer, and the capping layer successively in the fourth recess; and
  after removing the patterned mask layer, filling the third recess and the fourth recess with the electrically conductive material.

12. The method of claim 11, wherein the electrically conductive material in the third recess and the fourth recess physically contacts the capping layer.

13. A method of forming a semiconductor device, the method comprising:
  forming a first dummy gate structure and a second dummy gate structure over a fin protruding above a substrate, wherein the first dummy gate structure and the second dummy gate structure are surrounded by a dielectric layer; and
  replacing the first dummy gate structure and the second dummy gate structure with a first metal gate and a second metal gate, respectively, wherein the replacing comprises:
    removing the first dummy gate structure and the second dummy gate structure to form a first recess and a second recess in the dielectric layer, respectively;
    forming a gate dielectric layer in the first recess and in the second recess;
    forming an N-type work function layer and a capping layer successively over the gate dielectric layer in the second recess but not in the first recess; and
    filling the first recess and the second recess with an electrically conductive material.

14. The method of claim 13, wherein forming the N-type work function layer and the capping layer comprises:
  forming, in the first recess and the second recess, the N-type work function layer and the capping layer successively over the gate dielectric layer;
  forming a patterned mask layer over the capping layer, wherein the patterned mask layer has an opening that exposes the capping layer in the first recess;
  selectively removing the capping layer in the first recess using a first wet etch process; and
  after the first wet etch process, selectively removing the N-type work function layer in the first recess using a second wet etch process different from the first wet etch process.

15. The method of claim 14, wherein the first wet etch process is performed using a fluoride-containing chemical.

16. The method of claim 15, wherein the second wet etch process is performed using a mixture of an acid and an oxidizer, or using a mixture of a base and an oxidizer.

17. The method of claim 13, further comprising, before filling the first recess and the second recess, forming a glue layer in the first recess on the gate dielectric layer and in the second recess on the capping layer.

18. A method of forming a semiconductor device, the method comprising:
  removing a first dummy gate structure and a second dummy gate structure that are surrounded by a dielectric layer to form a first recess and a second recess in the dielectric layer, respectively;
  forming a gate dielectric layer, an N-type work function layer, and a capping layer successively in the first recess and in the second recess;
  removing the capping layer and the N-type work function layer from the first recess while keeping the capping layer and N-type work function layer in the second recess;
  after removing the capping layer and the N-type work function layer from the first recess, forming a glue layer in the first recess and the second recess, wherein the glue layer extends along and contacts the gate dielectric layer in the first recess, wherein the glue layer extends along and contacts the capping layer in the second recess; and
  after forming the glue layer, filling the first recess and the second recess with an electrically conductive material.

19. The method of claim 18, wherein removing the capping layer and the N-type work function layer comprises:
  forming a patterned mask layer over the capping layer, wherein an opening of the patterned mask layer exposes the capping layer in the first recess;
  selectively removing the exposed capping layer in the first recess to expose the N-type work function layer in the first recess using a first wet etch process; and
  selectively removing the exposed N-type work function layer in the first recess to expose the gate dielectric layer in the first recess using a second wet etch process different from the first wet etch process.

20. The method of claim 19, wherein the first wet etch process is performed using a fluoride-containing chemical, wherein the second wet etch process is performed using a mixture of an acid and an oxidizer, or using a mixture of a base and an oxidizer.

* * * * *